(12) United States Patent
Saito et al.

(10) Patent No.: US 11,631,804 B2
(45) Date of Patent: Apr. 18, 2023

(54) MAGNETORESISTIVE EFFECT ELEMENT AND MAGNETIC MEMORY

(71) Applicant: TOHOKU UNIVERSITY, Sendai (JP)

(72) Inventors: Yoshiaki Saito, Sendai (JP); Shoji Ikeda, Sendai (JP); Hideo Sato, Sendai (JP); Tetsuo Endoh, Sendai (JP)

(73) Assignee: TOHOKU UNIVERSITY, Sendai (JP)

( * ) Notice: Subject to any disclaimer, the term of this patent is extended or adjusted under 35 U.S.C. 154(b) by 0 days.

(21) Appl. No.: 16/969,771

(22) PCT Filed: Feb. 13, 2019

(86) PCT No.: PCT/JP2019/005091
§ 371 (c)(1),
(2) Date: Nov. 12, 2020

(87) PCT Pub. No.: WO2019/159962
PCT Pub. Date: Aug. 22, 2019

(65) Prior Publication Data
US 2021/0074910 A1 Mar. 11, 2021

(30) Foreign Application Priority Data
Feb. 13, 2018 (JP) .............................. JP2018-023297

(51) Int. Cl.
*H01L 43/04* (2006.01)
*G11C 11/16* (2006.01)
(Continued)

(52) U.S. Cl.
CPC ............ *H01L 43/04* (2013.01); *G11C 11/161* (2013.01); *G11C 11/1675* (2013.01);
(Continued)

(58) Field of Classification Search
CPC ....... H04L 43/04; H04L 27/222; H04L 43/06; H04L 43/10; G11C 11/161; G11C 11/18; H01F 10/325
See application file for complete search history.

(56) References Cited

U.S. PATENT DOCUMENTS 10,339,993 B1 * 7/2019 Schabes ................ H01F 41/307
10,497,417 B2 12/2019 Sasaki et al.
(Continued)

FOREIGN PATENT DOCUMENTS

JP 2013541219 A 11/2013
WO 2016159017 A1 10/2016
(Continued)

OTHER PUBLICATIONS

Miron, I. M., et al., Perpendicular Switching of a Single Ferromagnetic Layer Induced by In-Plane Current Injection, Nature, 2011, 476, pp. 189-193.
(Continued)

*Primary Examiner* — Farun Lu
(74) *Attorney, Agent, or Firm* — Procopio, Cory, Hargeaves & Savitch LLP

(57) ABSTRACT

A perpendicular magnetization type three-terminal SOT-MRAM that does not need an external magnetic field is provided. A magnetoresistance effect element where a first magnetic layer/nonmagnetic spacer layer/recording layer are disposed in order, and the first magnetic layer and the nonmagnetic spacer layer are provided to a channel layer.

24 Claims, 16 Drawing Sheets

(51) Int. Cl.
*G11C 11/18* (2006.01)
*H01L 27/22* (2006.01)
*H01L 43/06* (2006.01)
*H01L 43/10* (2006.01)
*H01F 10/32* (2006.01)

(52) U.S. Cl.
CPC ............ *G11C 11/18* (2013.01); *H01F 10/325* (2013.01); *H01L 27/222* (2013.01); *H01L 43/06* (2013.01); *H01L 43/10* (2013.01)

(56) References Cited

U.S. PATENT DOCUMENTS

| | | | |
|---|---|---|---|
| 2012/0098077 A1 | 4/2012 | Gaudin et al. | |
| 2015/0041934 A1* | 2/2015 | Khvalkovskiy | G11C 11/1675 257/421 |
| 2016/0276006 A1* | 9/2016 | Ralph | H01L 43/08 |
| 2016/0315118 A1* | 10/2016 | Kardasz | H01L 43/10 |
| 2017/0047107 A1* | 2/2017 | Berger | G11C 13/0069 |
| 2017/0222132 A1* | 8/2017 | Pinarbasi | H01L 43/12 |
| 2017/0222135 A1 | 8/2017 | Fukami et al. | |
| 2018/0019388 A1 | 1/2018 | Fukami et al. | |
| 2018/0261271 A1* | 9/2018 | Nunn | G01R 33/098 |
| 2020/0035282 A1* | 1/2020 | Lee | H01F 10/3259 |
| 2020/0043538 A1* | 2/2020 | Mihajlovic | H01L 43/08 |

FOREIGN PATENT DOCUMENTS

| | | |
|---|---|---|
| WO | 2016021468 A1 | 5/2017 |
| WO | 2017208880 A1 | 12/2017 |

OTHER PUBLICATIONS

Liu, L., et al., Spin-Torque Switching with the Giant Spin Hall Effect of Tantalum, Science, 2012, 336, pp. 555-558.

Fukami, D., et al., A Spin-Orbit Torque Switching Scheme with Collinear Magnetic Easy Axis and Current Configuration, Nature Nanotechnology, 2016, 11, pp. 621-625.

Takikawa, M., et al., In-Plane Current-Induced Magnetization Switching in CoGa/MnGa/MgO Films, Applied Physics Express, 2017, 10, 073004, 4 pgs.

International Preliminary Report on Patentability for related PCT App No. PCT/JP2019/005091 dated May 28, 2020, 16 pgs.

Fukami, S., et al., Magnetization Switching by Spin-Orbit Torque in an Antiferromagnet-Ferromagnet Bilayer System, Nature Material, Feb. 15, 2016, pp. 535-542.

You, L., et al., Switching of Perpendicularly Polarized Nanomagnets with Spin Orbit Torque without an External Magnetic Field by Engineering a Tilted Anisotropy, PNAS, Aug. 18, 2015, 112(33), pp. 10310-10315.

Yu, G., et al., Switching of Perpendicular Magnetization by Spin-Orbit in the Absence of External Magnetic Fields, Nature Nanotechnolgy, Jul. 9, 2014, pp. 548-554.

* cited by examiner

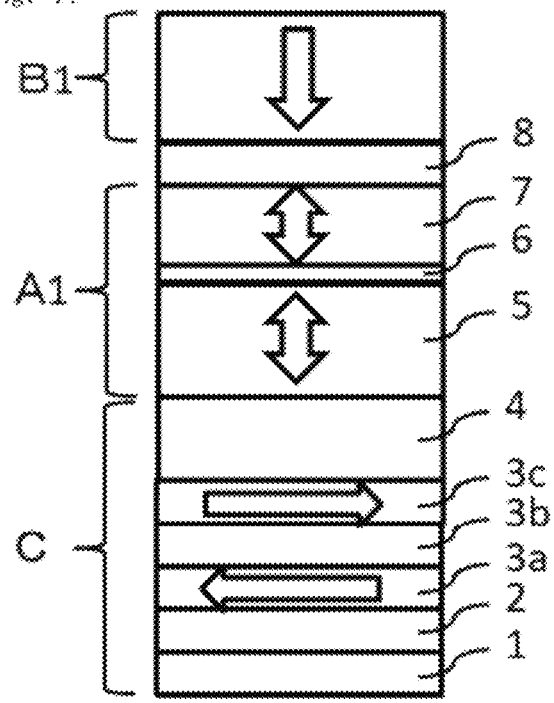
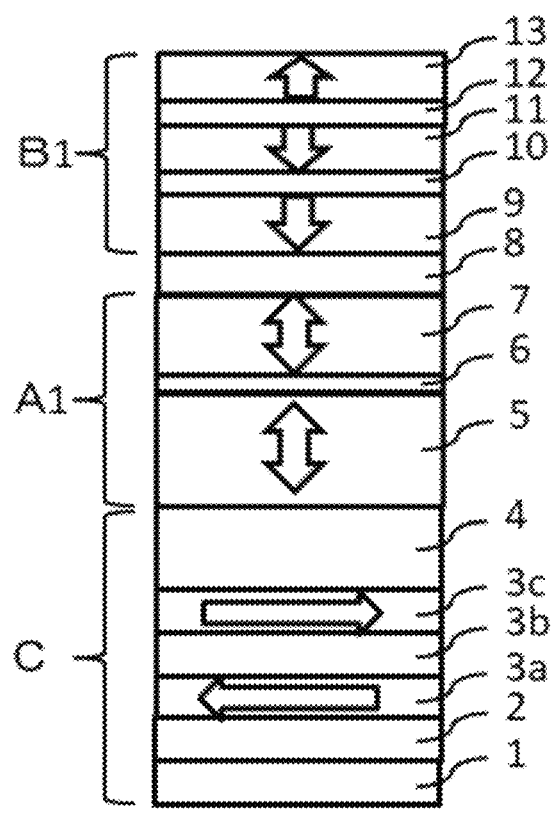

STT CURRENT    SOT CURRENT BRANCHES

Fig. 15
Fig. 15(a)
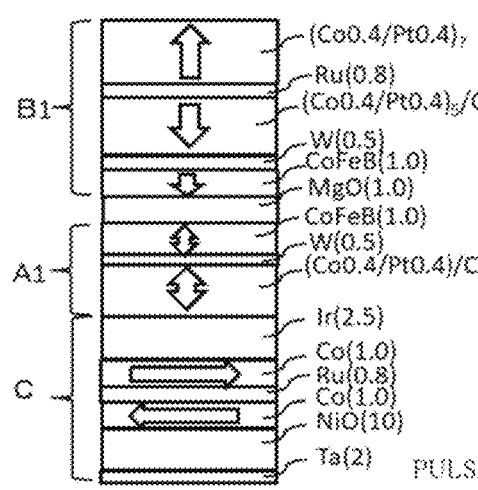
Fig. 15(b)
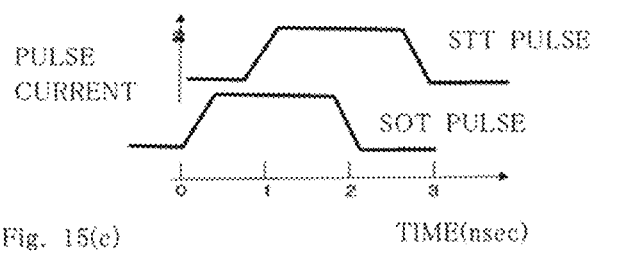
Fig. 15(c)
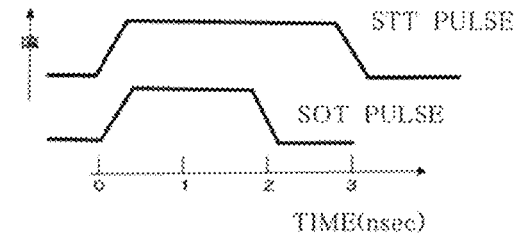
Fig. 15(d)
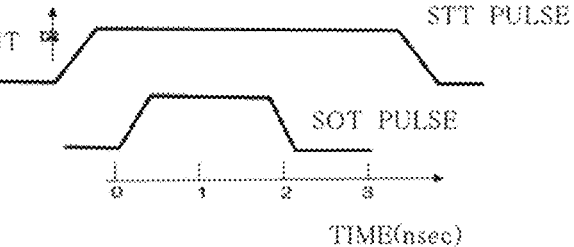

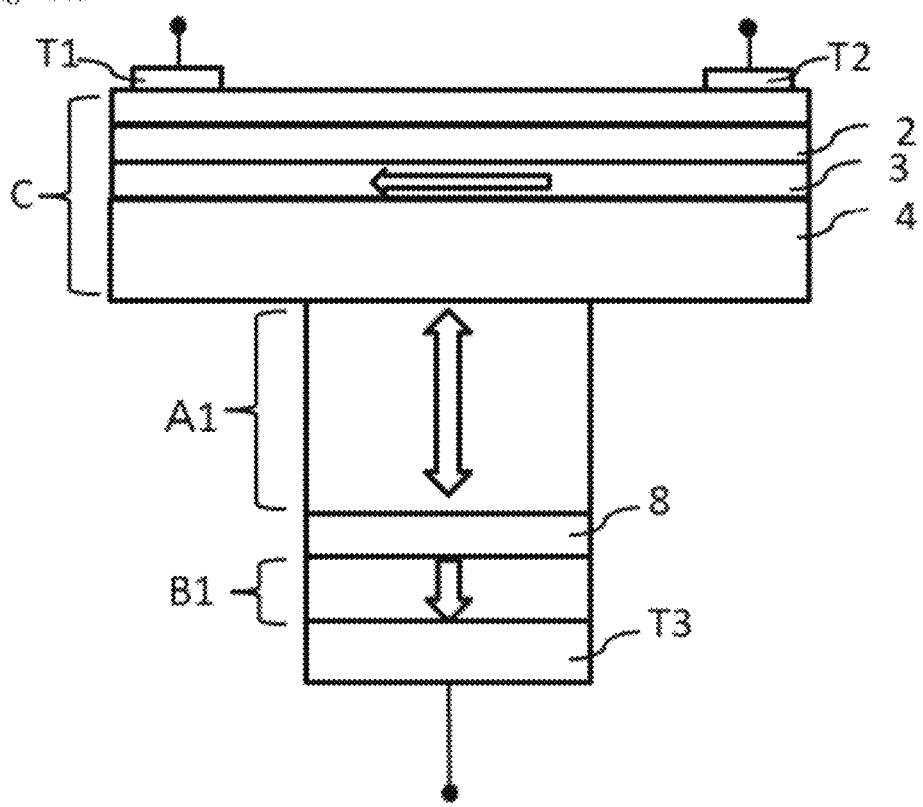

MAGNETORESISTIVE EFFECT ELEMENT AND MAGNETIC MEMORY

CROSS-REFERENCE TO RELATED APPLICATIONS

This application is a U.S. National Stage entry of PCT Application No: PCT/JP2019/005091 filed Feb. 13, 2019, which claims priority to Japanese Patent Application No. 2018-023297 filed Feb. 13, 2018, the contents of which are incorporated herein by reference.

TECHNICAL FIELD

The present invention relates to a magnetoresistance effect elements, and to magnetic memory provided with the magnetoresistance effect elements, and in particular relates to a spin-orbit torque magnetization reversal elements.

BACKGROUND ART

MRAM (Magnetic Random Access Memory: magnetic memory) is nonvolatile memory that uses MTJs (Magnetic Tunnel Junctions).

MRAM is gathering attention as next-generation nonvolatile memory, and nonvolatile memory for logic integrated circuits, as MRAM does not consume electric power during standby, has high-speed operability and high endurance, and also cell size can be miniaturized.

Bit information recorded in a magnetic layer (recording layer) of MRAM passes through a barrier layer and is read out using a TMR (Tunnel Magnetoresistance) effect.

Also, methods of writing to a magnetic layer (recording layer) include a method using a magnetic field and a method using a current. MRAMs that using the latter writing method include a two-terminal that writes hit information to the magnetic layer (recording layer) using spin-transfer-torque (STT), and a three-terminal that writes bit information to the magnetic layer (recording layer) using spin-orbit-torque (SOT) induced magnetization reversal and so forth. It is known that the three-terminal SOT-MRAM (spin-orbit torque magnetization reversal element, also referred to as SOT element), where the writing current path and reading current path differ, is more suitable for memory where particularly high-speed operation is required, as compared to the two-terminal STT-MRAM, since a wider voltage operation margin can be used.

The SOT element has a structure where magnetic tunnel junctions are formed on a channel layer formed of a heavy metal or the like, and writing of information is performed by applying a current to the channel layer to reverse the magnetization of the recording layer in the magnetic tunnel junction. A reading current is applied from one side of the channel layer through the magnetic tunnel junction during reading operation.

Further, three-terminal MRAMs using SOT include Y type, X type, XY type, and Z type, in accordance with the direction of axes of easy magnetization.

The Y type three-terminal MRAM is an arrangement where the magnetization is oriented in a direction orthogonal to the current (Y axis direction) in the plane of the substrate, and operation was verified in 2012 (see PTL 2, etc.). Issues regarding the Y type include a point of a large cell area, a point of increased effects of stray magnetic field, and further a point of marked increase in current required for reversal of magnetization at high-speed regions. However there are advantages in that no external magnetic field is needed, and magnetization can be reversed by a small current in low-speed region.

The X type three-terminal SOT-MRAM is an arrangement where the magnetization is oriented in a direction parallel to the current (X axis direction), and operation was verified in 2014 (see NPL 3, PTL 1, etc.). Issues regarding the X type include a point of a large cell area, a point of increased effects of stray magnetic field, a point of necessity of an external magnetic field, a point of writing current being large, and further a point of abnormalities in reversal behavior being observed, where errors occur in that reversed magnetization reverts in high-current region. However there is advantage in that high-speed magnetization reversal in the order of 1 nano second can be realized with a small current.

The XY type three-terminal MRAM is an arrangement where the magnetization is oriented in a direction that has an angle $\theta$ as to a direction (Y axis direction) orthogonal to a direction parallel to the current (X axis direction). This arrangement has both an advantage in that no external magnetic field is needed, in the same way as the Y type, and an advantage in that high-speed magnetization reversal in the order of 1 nano second can be realized with a small current, in the same way as the X type.

The Z type three-terminal MRAM is an arrangement where the magnetization is oriented in a direction perpendicular to the substrate (Z axis direction), and operation was verified in 2011 (see NPL 1, etc.). The aspect ratio of the Z type can be set to 1 due to the perpendicular magnetic film, there are expectations for this configuration in that large capacity and reduced costs can be realized with a smaller cell area than the above other types. Further, this arrangement has an advantage in that high-speed magnetization reversal in the order of 1 nano second can be realized with a small current, and an advantage in that effects of stray magnetic field is small. Meanwhile, the Z type has issues of (a) a point of an external magnetic field being necessary, (b) a point of writing current IC being large, and (c) a point of abnormalities in reversal behavior being observed at high-current regions.

CITATION LIST

Non Patent Literature

[NPL 1] Ioan Mihai Miron et. al., "Perpendicular switching of a single ferromagnetic layer induced by in-plane current injection", Nature 476, 189-193 (2011)

[NPL 2] Luqiao Liu et. al., "Spin-Torque Switching with the Giant Spin Hall Effect of Tantalum", Science 336, 555-558 (2012)

[NPL 3] S. Fukami, et. al., "A spin-orbit torque switching scheme with collinear magnetic easy axis and current configuration", Nature Nanotechnology 11, 621-625 (2016)

[NPL 4] M. Takikawa el al., "In-plane current-induced magnetization switching in CoGa/MnGa/MgO films" Applied Physics Express, 10, 073004 (2017).

[NPL 5] Guoqiang Yu et. al., "Switching of perpendicular magnetization by spin-orbit torques in the absence of external magnetic fields", Nature Nano. 9, 548-554 (2014)

[NPL 6] Long You, et. al., "Switching of perpendicularly polarized nanomagnets with spin orbit torque without an external magnetic field by engineering a tilted anisotropy" Proc. Natl. Acad. Sci. 112, 10310-10315 (2015)

[NPL 7] S. Fukami, et. al., "Magnetization switching by spin-orbit torque in an antiferromagnet-ferromagnet bilayer system" Nature Mater. 15, 535-541 (2016)

Patent Literature

[PTL 1] WO 2016/21468
[PTL 2] Japanese Translation of PCT Application No. 2013-541219

SUMMARY OF INVENTION

Technical Problem

Now, properties that are important for application of MRAMs, which are magnetoresistance effect elements, are that (i) the thermal stability index Δ is large, (ii) the writing current IC is small, (iii) the tunnel magnetoresistance ratio (TMR ratio) of the magnetoresistance effect element is large, and (iv) the element size is small. These properties are required, (i) for nonvolatility of the magnetic memory, (ii) to handle high-speed writing and also reduce electric power consumption. (iii) to handle high-speed reading, and (iv) to reduce the cell area and increase capacity.

While the Z type three-terminal MRAM (iv) has a small element size and the cell area can be reduced to increase capacity, there are the issues that (a) an external magnetic field is necessary, (b) the writing current IC is large, and (c) abnormalities in reversal behavior are observed at high-current regions, as described above.

Now, with regard to the point that (a) an external magnetic field is necessary, NPL 5 discloses a magnetic tunnel junction where an in-plane magnetization film is laid on a reference layer and a stray magnetic field is used to do away with the need for an external magnetic field. However, inter-cell interference occurs, and accordingly this cannot be used as memory technology. Also, NPL 6 discloses tilting the film thickness of the recording layer and tunnel junction layer for each element within the wafer to do away with the need for an external magnetic field. However, manufacturing elements with tilted film thickness for each element within a wafer is difficult, and application to memory is practically impossible. Further, NPL 7 discloses forming the channel layer of an antiferromagnetic heavy metal material, and using antiferromagnetic exchange coupling between the magnetic layer of the recording layer and the antiferromagnetic layer of the channel layer. However, magnetic moment of the interface is pinned in-plane using an antiferromagnetic material (PtMn or the like) for the heavy metal material of the channel layer, and there is concern of decrease in the stability index Δ due to shift in the magnetization curve with regard to information left unattended for a long time (nonvolatile).

Accordingly, all of the above known technology that does away with the need for an external magnetic field is substantially difficult to apply to a Z type three-terminal MRAM, and there has been a need to diligently study another method of solving the problem.

In light of the foregoing situation, the present invention has found a perpendicular magnetization type three-terminal SOT-MRAM in which (a) an external magnetic field is unnecessary, and also has completed a perpendicular magnetization type three-terminal SOT-MRAM where, at the same time, preferably (b) writing current IC small, and (c) abnormalities in reversal behavior are not observed at high-current regions.

Solution to Problem

In order to solve the above problems, a magnetoresistance effect element according to the present invention includes a channel layer (C), and a recording layer (A1) containing a ferromagnetic material, and provided adjacent to the channel layer (C). The channel layer (C) includes a first magnetic layer (3) and a nonmagnetic spacer layer (4), the nonmagnetic spacer layer (4) being provided adjacent to the recording layer (A1), and the first magnetic layer (3) being provided adjacent to the opposite side of the nonmagnetic spacer layer (4) from the recording layer (A1). The recording layer (A1) has an axis of easy magnetization in a film surface perpendicular direction. A direction of magnetization of the first magnetic layer (3) is an in-plane direction. The direction of magnetization of the recording layer (A1) is reversed by introducing current to the channel layer (C) that is in an approximately parallel direction or approximately anti parallel direction as to the direction of magnetization of the first magnetic layer (3).

The nonmagnetic spacer layer (4) preferably is configured of a material that adjusts, by a film thickness thereof, an interlayer exchange coupling strength between the recording layer (A1) and the first magnetic layer (3).

The nonmagnetic spacer layer (4) preferably includes at least one element of at least Ir, Pt, Pd, Os, Au, and Re. Also, small amounts or Rh, Ru, or the like may be mixed into the material for the nonmagnetic spacer layer (4) to form an alloy.

The film thickness of the nonmagnetic spacer layer (4) preferably is 1.2 nm to 5.0 nm in a case of including Ir as a primary element, 2.0 nm to 7.0 nm in a case of including Pt as a primary element, 1.0 nm to 5.0 nm in a case of including Pd as a primary element, 1.2 nm to 5.0 nm in a case of including Os as a primary element, 0.5 nm to 5.0 nm in a case of including Au as a primary element, and 0.5 nm to 5.0 nm in a case of including Re as a primary element.

The first magnetic layer (3) may include an element of at least one of Co, Fe, and Ni.

Preferably, the recording layer (A1) includes a second magnetic layer (6), a second nonmagnetic insertion layer (6), and a third magnetic layer (7), the second magnetic layer (5) is provided adjacent to the nonmagnetic spacer layer (4), the second nonmagnetic insertion layer (6) is provided adjacent to the opposite side of the second magnetic layer (5) from the nonmagnetic spacer layer (4), the third magnetic layer (7) is provided adjacent to the opposite side of the second nonmagnetic insertion layer (6) from the second magnetic layer (5), and the second magnetic layer (5) is configured of a multilayer film or an alloy film including at least Co, and has an axis of easy magnetization in the film surface perpendicular direction.

Preferably, the first magnetic layer (3) configuring the channel layer (C) includes a first divided magnetic layer (3a), a first nonmagnetic insertion layer (3b), and a second divided magnetic layer (3c), the second divided magnetic layer (3c) is provided adjacent to the nonmagnetic spacer layer (4), the first nonmagnetic insertion layer (3b) is provided adjacent to the opposite side of the second divided magnetic layer (3c) from the nonmagnetic spacer layer (4), the first divided magnetic layer (3a) is provided adjacent to the opposite side of the first nonmagnetic insertion layer (3b) from the second divided magnetic layer (3c), and the first divided magnetic layer (3a) and the second divided magnetic layer (3c) have in-plane magnetic anisotropy in opposite directions from each other.

Also, an antiferromagnetic layer (2) may be provided adjacent to the opposite side of the first magnetic layer (3) from the nonmagnetic spacer layer (4). The antiferromagnetic layer (2) may include O or Mn.

When writing to the magnetoresistance effect element according to the present invention, a write pulse current applied to a magnetic tunnel junction may be turned Off after a write pulse current applied to the channel layer (C).

Also, magnetic memory according to the present invention is provided with the above magnetoresistance effect element.

Advantageous Effects of Invention

According to the present invention, in a Z type magnetoresistance effect element having the advantages of a configuration where large capacity and reduced costs can be realized with a smaller cell area due to the perpendicular magnetic film, and realization of high-speed magnetization reversal in the order of 1 nano second with a small current, and an advantage in that effects of stray magnetic field are small, a magnetoresistance effect element and magnetic memory can be provided in which, moreover, (a) an external magnetic field is unnecessary.

Also, according to another example of the present invention, in a Z type magnetoresistance effect element, a magnetoresistance effect element and magnetic memory can be provided in which, in addition to (a) an external magnetic field being unnecessary, (b) writing current is small, and (c) abnormalities in reversal behavior are not observed at high-current regions.

BRIEF DESCRIPTION OF DRAWINGS

FIG. 11 is a longitudinal-sectional view showing another example of a configuration of a magnetoresistance effect element according to the present invention.

FIG. 12 is a longitudinal-sectional view showing another example of a configuration of a magnetoresistance effect element according to the present invention.

FIG. 15(a) is a longitudinal-sectional view, and FIG. 15(b) to FIG. 15(d) show pulse sequence examples in another example of a configuration of a magnetoresistance effect element according to the present invention.

FIG. 16D shows another example of a circuit configuration of a 1-bit memory cell using the magnetoresistance effect element according to the present invention.

DESCRIPTION OF EMBODIMENTS

A magnetoresistance effect element and magnetic memory according to the present invention will be described in detail below, with reference to the Figures.

Note that the Figures are only exemplary, and while description will be made with denotation by symbols, the Figures do not limit the present invention in any way.

Embodiment 1

Figure 1:
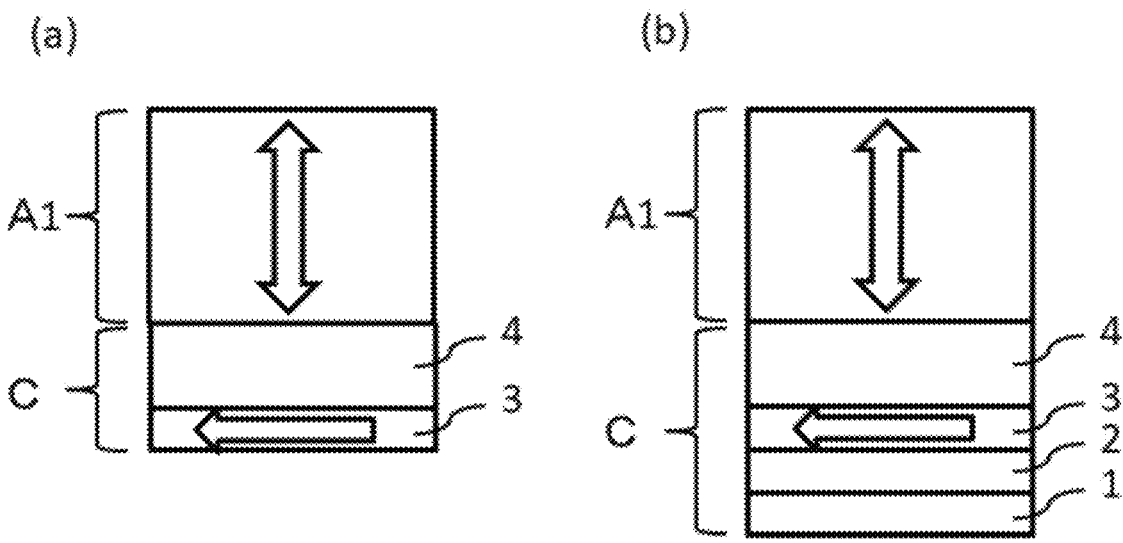
FIG. 1(a) and FIG. 1(b) are longitudinal-sectional views showing an example of a configuration of a magnetoresistance effect element according to the present invention.

FIG. 1(a) shows a basic configuration of Embodiment 1 of the present invention. The basic configuration of the magnetoresistance effect element is a first magnetic layer (3)/nonmagnetic spacer layer (4)/recording layer (A1) arrayed adjacently in order, the first magnetic layer (3)/nonmagnetic spacer layer (4) configuring part of a channel layer (C). Note that an antiferromagnetic layer (2) may be optionally disposed adjacently to the first magnetic layer (3), as well as a foundation layer (1) disposed adjacently to the antiferromagnetic layer (2), in the channel layer (C), as shown in FIG. 1(b).

The channel layer (C) is configured of a combination of materials having adequate properties to generate a spin current sufficient to reverse the recording layer (A) in the magnetic tunnel junction when a current is introduced in an approximately parallel direction to the recording layer (A1). Further, the channel layer (C) is configured of a combination of materials where no problem such as decrease in the stability index Δ will occur even if there is no external magnetic field. Introducing writing current IC to the channel layer (C) generates spin current, the direction of magnetization of the adjacent recording layer (A1) is reversed, and writing to the magnetoresistance effect element is performed.

The shape of the channel layer (C) is not limited in particular as long as a shape where the writing current IC can be made to flow and magnetization reversal of the recording layer (A1) can be efficiently performed. However, a columnar shape that is circular in planar view is most desirable since the magnetization direction of the recording layer (A1) is the film surface perpendicular direction and the aspect ratio can be set to 1 to reduce the cell area. The shape may also be a square cuboid. The shape may also be a planar form extending in the direction of the writing current IC.

As described earlier, conventional Z type three-terminal magnetoresistance effect elements basically need an external magnetic fixed in order to perform magnetization reversal. Accordingly, in recent years, performing magnetization reversal using a stray magnetic field from the element, or exchange interaction at an antiferromagnetic material/magnetic material interface has been studied, to enable magnetization reversal by current pulses along, without using an external magnetic field. However, using a stray magnetic field from the element causes variance in writing current among elements, and the method of using exchange interaction at the antiferromagnetic material/magnetic material interface causes decrease in the stability index Δ. It has been found from the study made by the present inventors that the reason for this is that in a case where the magnetic layers of the antiferromagnetic layer (2) and the recording layer (A1) are adjacent and bound, the interlayer exchange coupling force Jex of the magnetic layers of the antiferromagnetic layer (2) and the recording layer (A1) is too strong.

In order to adjust the aforementioned interlayer exchange coupling force (exchange coupling constant) Jex, the first magnetic layer (3) is interposed in contact with the magnetic layer of the recording layer (A1) across the nonmagnetic spacer layer (4). Accordingly, the interlayer exchange coupling force Jex between the magnetic layers of the first magnetic layer (3) and recording layer (A1) acts, and the strength of Jex can be adjusted by adjusting the film thickness of the nonmagnetic spacer layer (4) or the first magnetic layer (3). At this time, the direction of magnetization of the first magnetic layer (3) is preferably fixed in the in-plane direction, and in the approximately parallel direction or approximately anti-parallel direction as to the direction of current applied to the nonmagnetic spacer layer (4) when writing. That is to say, current having a component in the approximately parallel direction or approximately anti-parallel direction to the direction of magnetization of the first magnetic layer (3) is introduced to the channel layer (C), whereby the direction of magnetization of the recording layer (A1) can be reversed.

The nonmagnetic spacer layer (4) adjusts the interlayer exchange coupling force Jex between the recording layer (A1) and the first magnetic layer (3) of the channel layer (C) by the film thickness thereof. Examples of materials of the nonmagnetic spacer layer (4) where the interlayer exchange coupling force Jex changes in accordance with film thickness include materials including at least one element of Ir, Pt, Pd, Os, Au, and Re.

The nonmagnetic spacer layer (4) may also include other elements to an extent where the crystalline structure is not changed. Examples include Ta, B, Nb, V, and so forth. The strength of the exchange coupling force Jex can also be adjusted by changing the film thickness of the first magnetic layer (3), or alternating the first magnetic layer (3) and a spacer layer material in a multilayer film arrangement, besides changing the film thickness of the nonmagnetic spacer layer (4). Ideally, reducing the first magnetic layer (3) increases Jex in inverse proportionate, within a range of film thickness where the magnetism of the first magnetic layer (3) is not lost. Also, increasing the total count of layers in the multi-layer film tends to increase the strength of Jex.

In a case of containing Ir as the primary element, the film thickness of the nonmagnetic spacer layer (4) preferably is 0.8 nm to 10 nm, more preferably is 1.2 nm to 5.0 nm, and even more preferably is 2.25 nm to 5.0 nm.

In a case of containing Pt as the primary element, the film thickness of the nonmagnetic spacer layer (4) preferably is 2.0 nm to 10 nm, more preferably is 2.0 nm to 7.0 nm, and even more preferably is 2.0 nm to 5.0 nm.

In a case of containing Pd as the primary element, the film thickness of the nonmagnetic spacer layer (4) preferably is 1 nm to 10 nm, more preferably is 1.0 nm to 5.0 nm, and even more preferably is 1.0 nm to 4.0 nm.

In a case of containing Os as the primary element, the film thickness of the nonmagnetic spacer layer (4) preferably is 0.9 nm to 8 nm, more preferably is 1.2 nm to 5.0 nm, and even more preferably is 2.2 nm to 4.0 nm.

In a case of containing Au as the primary element, the film thickness of the nonmagnetic spacer layer (4) preferably is 0.5 nm to 5 nm, and more preferably is 2.0 nm to 4.0 nm.

In a case of containing Re as the primary element, the film thickness of the nonmagnetic spacer layer (4) preferably is 0.5 nm to 5 nm, and more preferably is 2.0 nm to 4.0 nm.

The reason will be described later.

The first magnetic layer (3) of the channel layer (C) is configured of a magnetic element having in-plane magnetic anisotropy. An allow including at least Co, Fe, and Ni is preferable.

The film thickness of the first magnetic layer (3) of the channel layer (C) preferably is 1.0 nm to 10 nm, and more preferably is 1.0 nm to 3.0 nm. This is because the larger the film thickness is, the stronger the strength of the exchange coupling force Jex can be made to be. The strength thereof is inversely proportionate to the film thickness of the first magnetic layer (3).

The antiferromagnetic layer (2) of the channel layer (C) preferably includes O (oxygen) or Mn (manganese), and more preferably has insulation properties. It is further preferable to use a material such that a larger part of the introduced current flows to the nonmagnetic spacer layer (4) side of the channel layer (C), and sufficiently generates spin current at the nonmagnetic spacer layer (4) side by the spin Hall effect and the Rashba-Edelstein effect. Examples include alloys such as PtMn, IrMn, FeMn, NiMn, and so forth, and oxides such as NiO, FeOx, and so forth, with NiO and FeOx being more preferable.

The antiferromagnetic layer (2) of the channel layer (C) may also be a material where a transition metal has been added to the above Mn compounds or oxides as appropriate, and may be a material obtained by doping an electroconductive material or the like with the above Mn compounds or oxides. Also, B, C, N, O, Al, Si, P, Ga, Ge, or the like may be added to improve electrical material properties or the like.

The film thickness of the antiferromagnetic layer (2) of the channel layer (C) preferably is 5 nm to 30 nm, and more preferably is 7 nm to 15 nm.

The recording layer (A1) is made with a material, film thickness, and layer configuration, having an axis of easy magnetization in the film surface perpendicular direction. At least one magnetic layer including at a magnetic element of at least Co. Fe, Ni, or the like, is included.

The total film thickness of the magnetic layer of the recording layer (A1) preferably is 0.8 nm to 7.0 nm, and more preferably is 1.0 nm to 3.5 nm.

The shape of the recording layer (A1) preferably is a columnar shape that is circular in planar view to reduce the cell area, but may have two-fold symmetry, such as an ellipse or the like.

Note that for an actual magnetoresistance effect element, a configuration is exemplified where a barrier layer is provided adjacently on the opposite side of the recording layer (A1) from the channel layer (C), and a reference layer is provided adjacent on the side of the barrier layer opposite from the recording layer (A1) in the basic configuration according to Embodiment 1.

The first magnetic layer (3) and nonmagnetic spacer layer (4) are interposed between the antiferromagnetic layer (2) and the magnetic layers of the recording layer (A1) to adjust the interlayer exchange coupling force Jex between the magnetic layers of the antiferromagnetic layer (2) and recording layer (A1) in Embodiment 1. The reason will be described in detail.

When a nonmagnetic layer is present between the magnetic layers, the interlayer exchange coupling force Jex between the two magnetic layers has a feature of exhibiting oscillation in interlayer exchange coupling due to the effects of RKKY interaction, in accordance with the film thickness of the nonmagnetic layer, with regard to certain elements. The oscillation cycle of this oscillation phenomenon is determined by the wavenumber of the Fermi surface nesting vector in the direction of film growth, a standing wave of this wavenumber is generated in the nonmagnetic layer between the two magnetic layers, thereby creating a quantum well state. Also, where there is no Fermi surface nesting vector, the strength of Jex does not show oscillation, and exhibits monotonous decrease.

Figure 18:
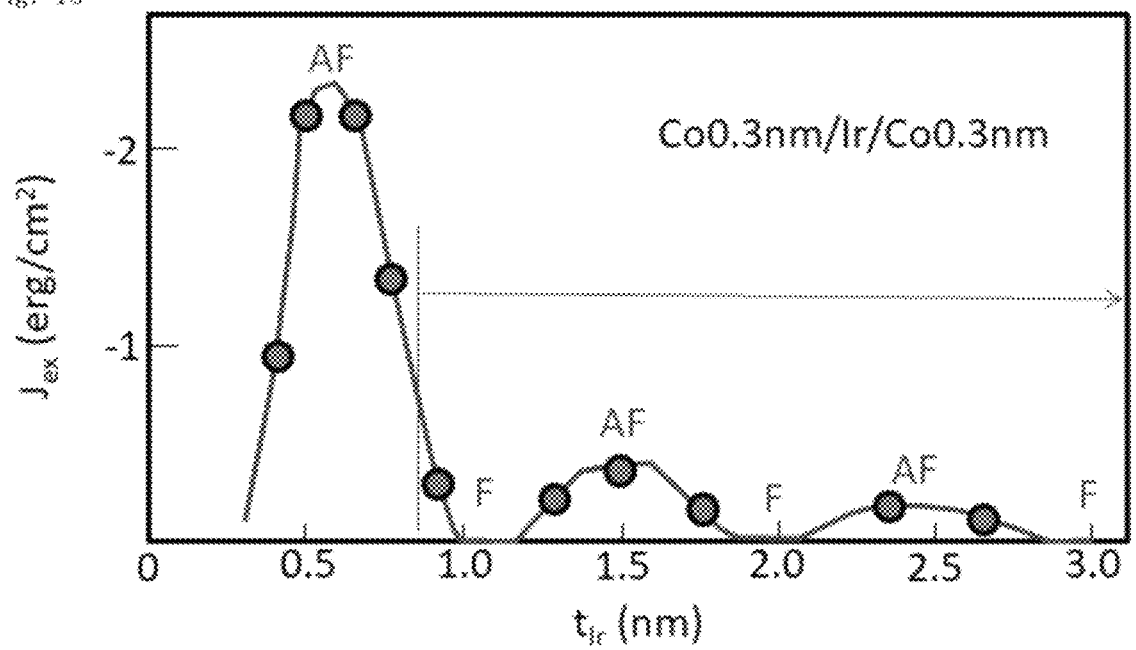
FIG. 18 is a graph showing a relation between a film thickness of Ir and interlayer exchange coupling force Jex.

FIG. 18 shows a relation between the film thickness of Ir and the interlayer exchange coupling force Jex of the magnetic layers. The interlayer exchange coupling force Jex between Co magnetic layers shown in FIG. 18 can be obtained by measuring magnetic properties of specimens with varying Ir film thicknesses in a tri-layer film of Co/Ir/Co, and performing calculation from saturation field Hs of magnetization.

It can be understood from FIG. 18 that inflection points where the value of the interlayer exchange coupling force Jex is low are present around Ir film thicknesses of 0.5 nm to 0.8 nm, 1.3 nm to 1.8 nm, and 2.3 nm to 2.8 nm. The strength of the interlayer exchange coupling force Jex is decreasing, so taking into consideration the fact that the Ir film thickness where the absolute value of the interlayer exchange coupling force Jex is between 0.001 erg/cm2 and 0.8 erg/cm2 is no less than 0.8 nm, and that the SOT current reversal efficiency drops if the film thickness is too large, both the interlayer exchange coupling force Jex and reversal current can be effectively lowered between the antiferromagnetic layer (2) and the magnetic layers of the recording layer (A1) by adjusting the film thickness of Ir to preferably be 0.8 nm to 10 nm, more preferably be 1.2 nm to 5.0 nm, and even more preferably be 2.25 nm to 5.0 nm.

Figure 19:
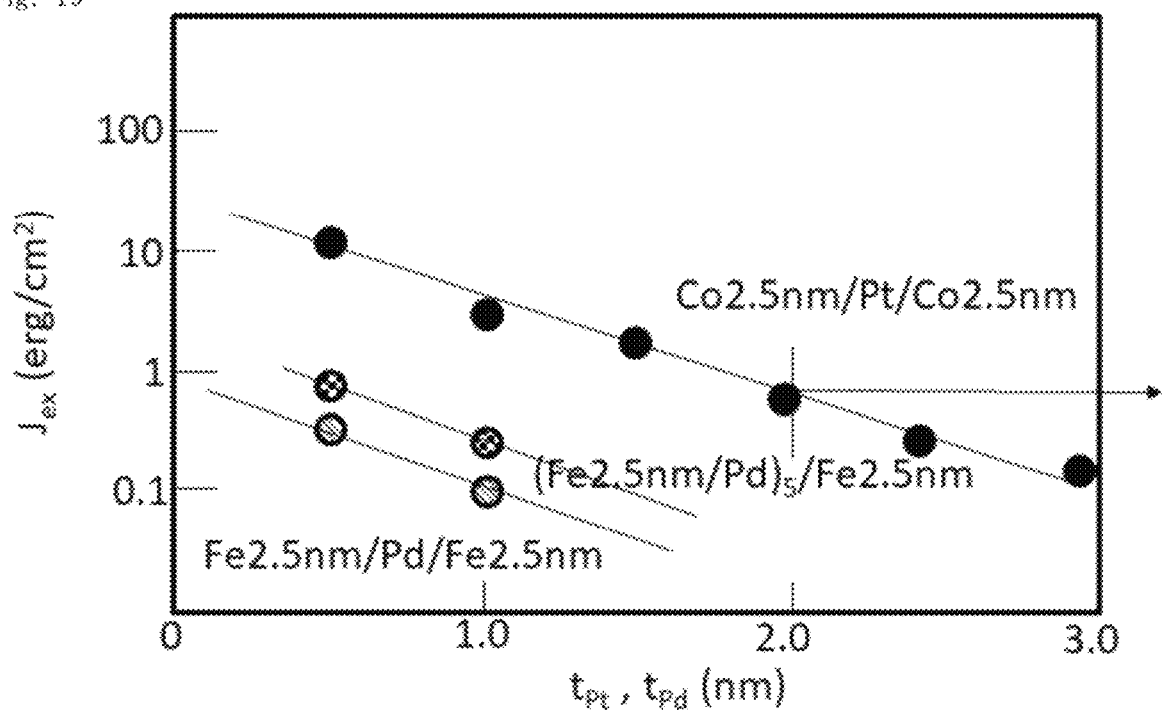
FIG. 19 is a graph showing a relation between a film thickness of Pt and Pd and interlayer exchange coupling force Jex.

FIG. 19 shows a relation between the film thickness of Pt and Pd and the interlayer exchange coupling force Jex of the magnetic layers.

The interlayer exchange coupling force Jex between Co magnetic layers shown in FIG. 19 can be obtained by measuring ferromagnetic resonance of a tri-layer film of Co/Pt/Co. It can be seen that in the case of Pt, the sign of the interlayer exchange coupling force Jex is positive (ferromagnetic interaction), and exhibits monotonous decrease in accordance with the film thickness. That is to say, taking into consideration the fact that the Pt film thickness where the absolute value of the interlayer exchange coupling force Jex is between 0.001 erg/cm2 and 0.8 erg/cm2 is no less than 2 nm, and that the SOT current reversal efficiency drops if the film thickness is too large, both the interlayer exchange coupling force Jex and reversal current can be effectively lowered between the antiferromagnetic layer (2) and the magnetic layers of the recording layer (A1) by adjusting the film thickness of Pt to preferably be 2 nm to 10 nm, more preferably be 2 nm to 7 nm, and even more preferably be 2 nm to 5 nm.

The interlayer exchange coupling force Jex between Fe magnetic layers shown in FIG. 19 can be obtained by measuring ferromagnetic resonance of a tri-layer film of Fe/Pd/Fe or a Fe/Pd multilayer film. It can be seen that in the case of Pd as well, the sign of interlayer exchange coupling force Jex is positive (ferromagnetic interaction), and exhibits monotonous decrease in accordance with the film thickness. That is to say, taking into consideration the fact that the Pd film thickness where the absolute value of the interlayer exchange coupling force Jex is between 0.001 erg/cm2 and 0.8 erg/cm2 is no less that 1 nm, and that the SOT current reversal efficiency drops if the film thickness is too large, both the interlayer exchange coupling force Jex and reversal current can be effectively lowered between the antiferromagnetic layer (2) and the magnetic layers of the recording layer (A1) by adjusting the film thickness of Pd to preferably be 1 nm to 10 nm, more preferably be 1.0 nm to 5.0 nm, and even more preferably be 1.0 nm to 4.0 nm.

Figure 20:
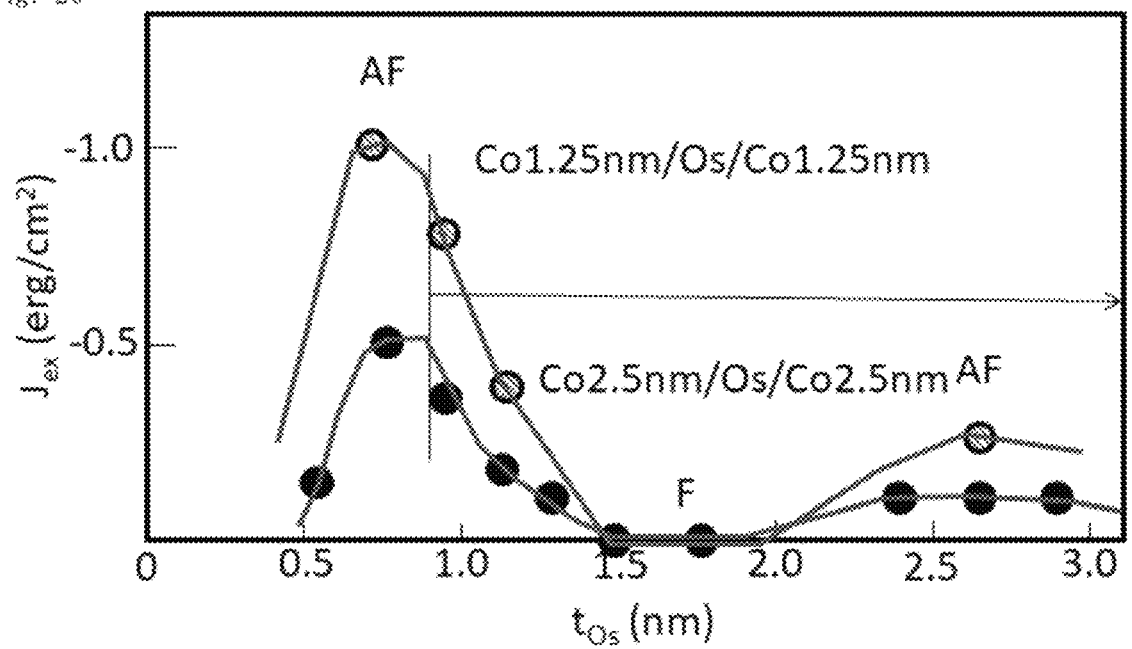
FIG. 20 is a graph showing a relation between a film thickness of Os and interlayer exchange coupling force Jex.

FIG. 20 shows a relation between the film thickness of Os and the interlayer exchange coupling force Jex of the magnetic layers. The interlayer exchange coupling force Jex between Co magnetic layers shown in FIG. 20 can be obtained by measuring magnetic properties of specimens with varying Os film thicknesses in a tri-layer film of Co/Os/Co, and performing calculation from saturation field Hs of magnetization. It can be understood that inflection points where the value of the interlayer exchange coupling force Jex is low are present around Os film thicknesses of 0.6 nm to 1.1 nm, and 2.2 nm to 3.0 nm. The strength of the interlayer exchange coupling force Jex is decreasing, so taking into consideration the fact that the Os film thickness where the absolute value of the interlayer exchange coupling force Jex is between 0.001 erg/cm2 and 0.8 erg/cm2 is no less than 0.9 nm, and that the SOT current reversal efficiency drops if the film thickness is too large, both the interlayer exchange coupling force Jex and reversal current can be effectively lowered between the antiferromagnetic layer (2) and the magnetic layers of the recording layer (A1) by adjusting the film thickness of Os to preferably be 0.9 nm to 8 nm, more preferably be 1.2 nm to 5.0 nm, and even more preferably be 2.2 nm to 4.0 nm.

Figure 21:
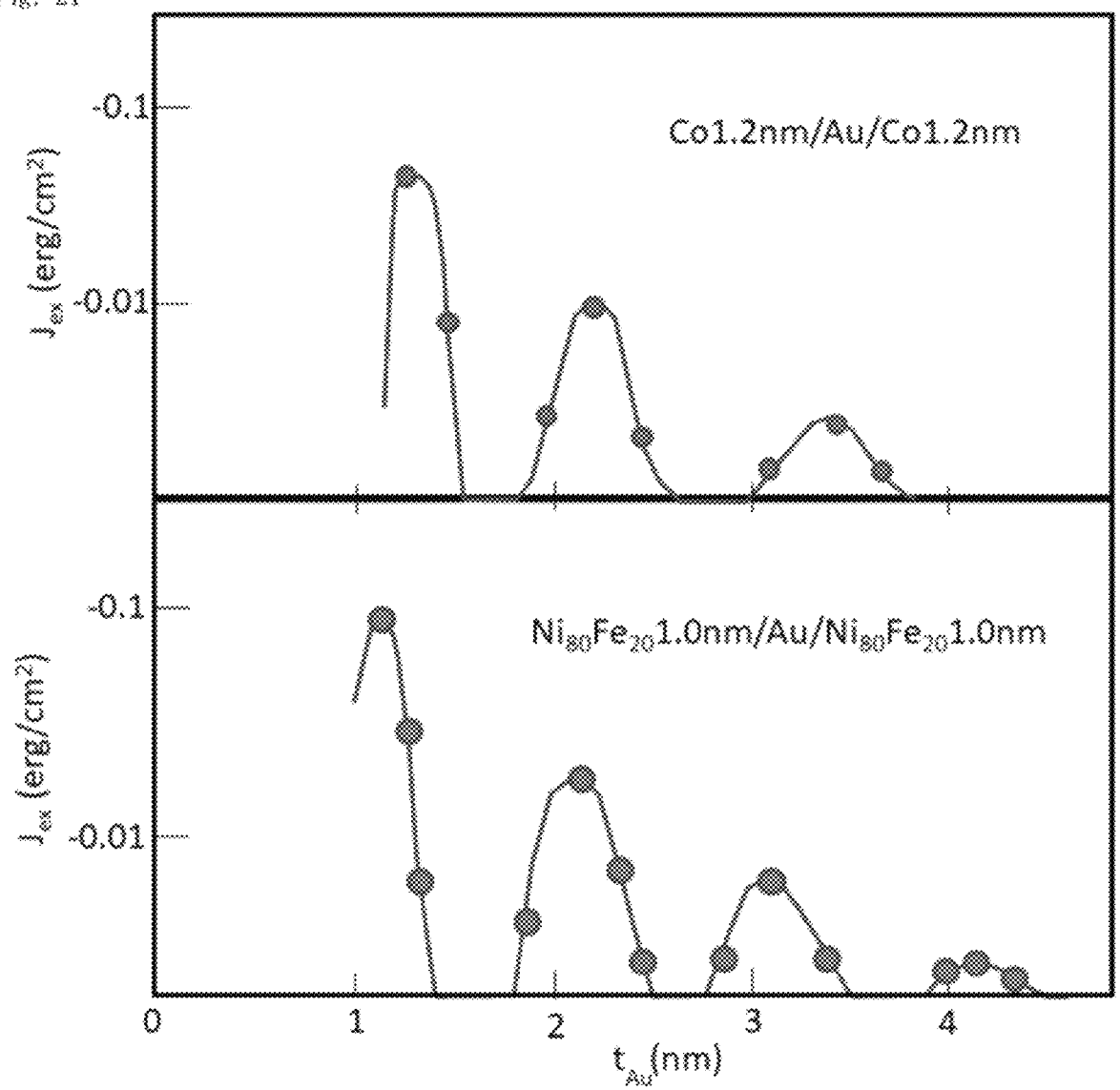
FIG. 21 is a graph showing a relation between a film thickness of Au and interlayer exchange coupling force Jex.

FIG. 21 shows a relation between the film thickness of Au and the interlayer exchange coupling force Jex of the magnetic layers. The interlayer exchange coupling force Jex between Co magnetic layers shown in FIG. 21 can be obtained by measuring magnetic properties of specimens with varying Au film thicknesses in a tri layer films of Co/Au/Co, and performing calculation from saturation field Hs of magnetization. The interlayer exchange coupling force Jex between NiFe magnetic layers can be obtained by measuring magnetic properties of specimens with varying Au film thicknesses in a tri-layer films of NiFe/Au/NiFe, and performing calculation from saturation field Hs of magnetization.

It can be understood that inflection points where the value of the interlayer exchange coupling force Jex is low are present around Au film thicknesses of 1.1 nm to 1.5 nm, 2.0 nm to 2.4 nm, and 3.1 nm to 3.6 nm, in a case where Co is the magnetic material. In a case of using NiFe, the positions of the inflection points slightly differ, but the strength exhibited is approximately the same values. The strength of the interlayer exchange coupling force Jex is decreasing, so taking into consideration the fact that the Au film thickness where the absolute value of the interlayer exchange coupling force Jex is between 0.001 erg/cm2 and 0.8 erg/cm2 is no less than 0.5 nm, and that the SOT current reversal efficiency drops if the film thickness is too large, both the interlayer exchange coupling force Jex and reversal current can be effectively lowered between the antiferromagnetic layer (2) and the magnetic layers of the recording layer (A1) by adjusting the film thickness of Au to preferably be 0.5 nm to 5 nm, and more preferably be 2.0 nm to 4.0 nm.

Figure 22:
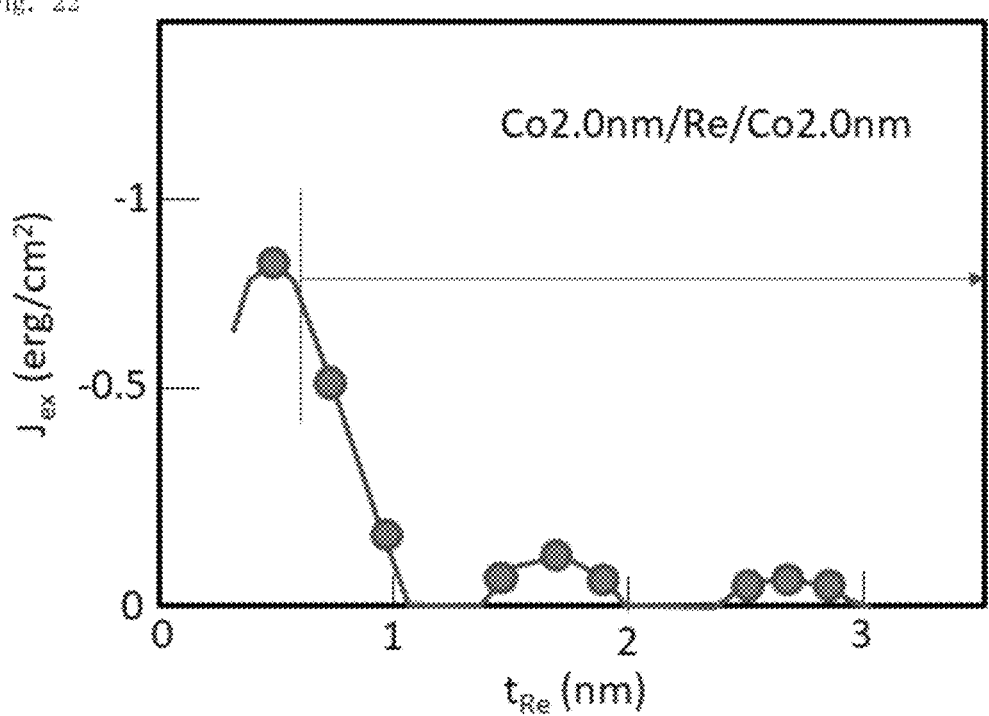
FIG. 22 is a graph showing a relation between a film thickness of Re and interlayer exchange coupling force Jex.

FIG. 22 shows a relation between the film thickness of Re and the interlayer exchange coupling force Jex of the magnetic layers. The interlayer exchange coupling force Jex between Co magnetic layers shown in FIG. 22 can be obtained by measuring magnetic properties of specimens with varying Re film thicknesses in a tri-layer film of Co/Re/Co, and performing calculation from saturation field Hs of magnetization. It can be understood that inflection points where the value of the interlayer exchange coupling force Jex is low are present around Re film thicknesses of 0.4 nm to 0.8 nm, 1.4 nm to 1.9 nm, and 2.5 nm to 2.9 nm. The strength of the interlayer exchange coupling force Jex is decreasing, so taking into consideration the fact that the Re film thickness where the absolute value of the interlayer exchange coupling force Jex is between 0.001 erg/cm2 and 0.8 erg/cm2 is no less than 0.5 nm, and that the SOT current reversal efficiency drops if the film thickness is too large, both the interlayer exchange coupling force Jex and the reversal current can be effectively lowered between the antiferromagnetic layer (2) and the magnetic layers of the recording layer (A1) by adjusting the film thickness of Re to preferably be 0.5 nm to 5 nm, and more preferably be 2.0 nm to 4.0 nm.

Embodiment 2

Figure 2:
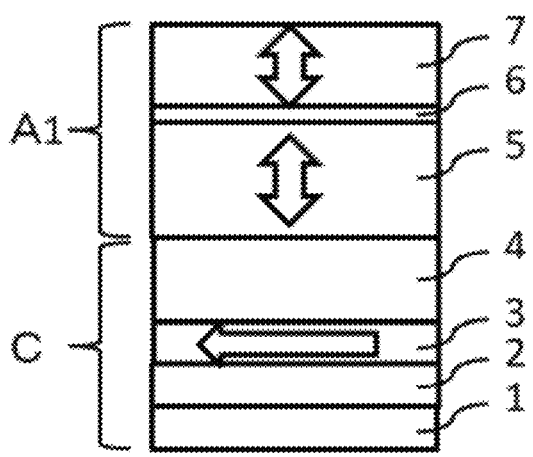
FIG. 2 is a longitudinal-sectional view showing another example of a configuration of a magnetoresistance effect element according to the present invention.

FIG. 2 shows a basic configuration of Embodiment 2 of the present invention. The configuration of this magnetoresistance effect element is the antiferromagnetic layer (2)/first magnetic layer (3)/nonmagnetic spacer layer (4)/second magnetic layer (5)/second nonmagnetic insertion layer (6)/third magnetic layer (7) arrayed adjacently in order, the antiferromagnetic layer (2)/first magnetic layer (3)/nonmagnetic spacer layer (4) configuring part of the channel layer (C), and the second magnetic layer (5)/second nonmagnetic insertion layer (6)/third magnetic layer (7) configuring the recording layer (A1). The details of Embodiment 2 are the same as those of Embodiment 1, except for the following points.

The second magnetic layer (5) of the recording layer (A1) is configured of a single-metal film, alloy film, or a multi-layer film that has its axis of easy magnetization in the film surface perpendicular direction and that includes at least one of Co, Fe, and Ni.

Examples of the single-metal film or alloy film include Co, Fe, Ni, CoFe, CoNi, FeNi, CoFeNi, and so forth, and B, C, N, O, Al, Si, P, Ga, Ge, or the like may be added to improve electrical material properties or the like.

The film thickness of the single-metal film or alloy film preferably is set to a range of 0.5 nm to 5 nm, and more preferably 0.5 nm to 2.5 nm.

In a case of using a ferromagnetic/nonmagnetic multilayer film for the second magnetic layer (5) of the recording layer (A1), an arrangement, where perpendicular magnetic anisotropy constant Ku and spin Hall angle ΘSH are large is desirable. Examples include Co/Pt, Co/Pd, and so forth. When the spin Hall angle ΘSH is large, magnetization reversal efficiency regarding SOT increases, and accordingly the writing current IC can be small even with a material where the perpendicular magnetic anisotropy constant Ku is large. Note that there is a relation where the writing current IC becomes large value when a damping constant α is large in magnetization reversal by STT, but in a case of using MTJ having a perpendicular magnetic film, even if there is a large damping constant α in magnetization reversal regarding SOT, this is unrelated to the writing current IC. In a case of using a multi-layer film, the thermal stability index Δ can be improved by increasing the total count of layers. For example, in a multilayer structure of Co 0.4 nm/Pt 0.4 nm, the thermal stability index Δ for a two-fold layered magnetoresistance effect element 20 nm in diameter was 210, and the thermal stability index Δ for a three-fold layered magnetoresistance effect element 10 nm in diameter was 79. Note that in recent years, the thermal stability index Δ required in magnetoresistance effect elements is no less than 60.

Also, current reversal efficiency can be improved by applying the writing current (pulse current, SOT current) to the channel layer (C) and also applying the writing current (pulse current, STT current) to the magnetic tunnel junction (in a film surface perpendicular direction regarding the recording layer).

The second nonmagnetic insertion layer (6) of the recording layer (A1) is configured of a nonmagnetic element such as W, Ta, Mo, or the like. One object of inserting the second nonmagnetic insertion layer (6) is for the adjacent third magnetic layer (7) to be in an amorphous state. One object of placing the third magnetic layer (7) in an amorphous state is, in a case where the barrier layer layered adjacent to the recording layer (A1) is MgO, for (100)-oriented MgO, increasing the tunnel magnetoresistance ratio (TMR ratio).

The film thickness of the second nonmagnetic insertion layer (6) preferably is set to a range of 0.25 nm to 1.0 nm, and more preferably 0.3 nm to 0.6 nm.

The third magnetic layer (7) of the recording layer (A1) includes at least one of Co, Ni, and Fe. B, C, N, O, Al, Si, P, Ga, Ge, or the like may be added to improve electrical material properties or the like. Co, CoB, Ni, NiB, Fe, FeB, CoFe, CoNi, NiFe, CoFeB, and so forth are preferable and CoFe is more preferable.

The film thickness of the third magnetic layer (7) preferably is set to a range of 1.0 nm to 2.5 nm, and more preferably 1.0 nm to 1.7 nm.

Embodiment 3

Figure 3:
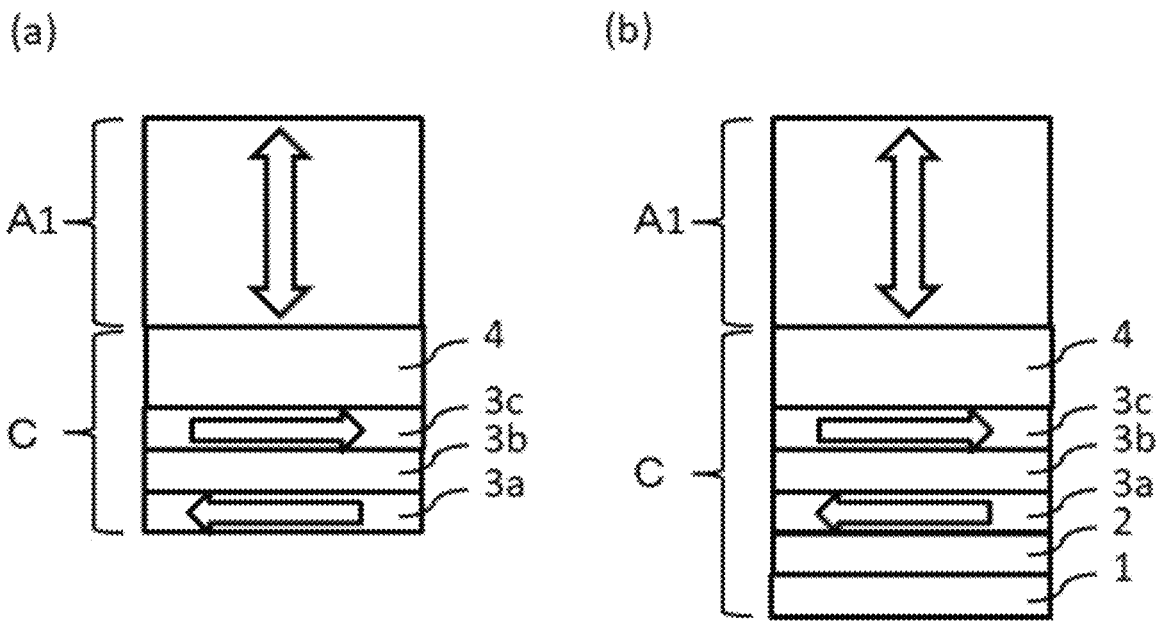
FIG. 3(a) and FIG. 3(b) are longitudinal-sectional views showing another example of a configuration of a magnetoresistance effect element according to the present invention.

FIG. 3(a) shows a basic configuration of Embodiment 3 of the present invention. The configuration of this magnetoresistance effect element is a first divided magnetic layer (3a)/first nonmagnetic insertion layer (3b)/second divided magnetic layer (3c)/nonmagnetic spacer layer (4)/recording layer (A1) arrayed adjacently in order, the first divided magnetic layer (3a)/first nonmagnetic insertion layer (3b)/ second divided magnetic layer (3c)/nonmagnetic spacer layer (4) configuring part of the channel layer (C). Note that an antiferromagnetic layer (2) may be optionally disposed in the channel layer (C) adjacently to the first divided magnetic layer (3a), as well as a foundation layer (1) disposed adjacently to the antiferromagnetic layer (2), as shown in FIG. 3(b). The details of Embodiment 3 are the same as those of Embodiment 1, except for the following points.

The first divided magnetic layer (3a), first nonmagnetic insertion layer (3b), and second divided magnetic layer (3c) of the channel layer (C) replace the first magnetic layer (3) in Embodiment 1. That is to say, the first divided magnetic layer (3a), first nonmagnetic insertion layer (3b), and second divided magnetic layer (3c) are interposed between the antiferromagnetic layer (2) and the magnetic layers of the recording layer (A1) along with the nonmagnetic spacer layer (4), to adjust the interlayer exchange coupling force Jex of the antiferromagnetic layer (2) and the magnetic layers of the recording layer (A1). The first divided magnetic layer (3a)/first nonmagnetic insertion layer (3b)/second divided magnetic layer (3c) structure may be a (magnetic layer/nonmagnetic insertion layer)×n layers/magnetic layer structure with a further increase in the count of films layered, but excessively increasing the total layer count increases SOT reversal current due to current branching to this layer. When the first nonmagnetic insertion layer (3b) is adjusted so that the spin directions between the first divided magnetic layer (3a) and the second divided magnetic layer (3c) are anti-parallel coupling, the influence of the stray magnetic field from the magnetic layer (3) to the recording layer (A1) can be eliminated, which is more preferable.

The first divided magnetic layer (3a) and second divided magnetic layer (3c) of the channel layer (C) are configured of magnetic elements that have in-plane magnetic anisotropy. An alloy containing at least one of Co, Fe, and Ni is preferable, and B is more preferably not contained from the perspective of exchange coupling force.

The first nonmagnetic insertion layer (3b) of the channel layer (C) is configured of a nonmagnetic element such as Ru, Ir, Rh, Os, Re, or an alloy or the like thereof.

In the case of the present Embodiment 3 where the first magnetic layer (3) of the channel layer (C) according to the Embodiment 1 is replaced by the first divided magnetic layer (3a), first nonmagnetic insertion layer (3b), and second divided magnetic layer (3c), the first divided magnetic layer (3a) and second divided magnetic layer (3c) have in-plane magnetic anisotropy in opposite directions from each other. The configuration of the present Embodiment 3 where the first nonmagnetic insertion layer (3b) is interposed is preferable from the perspective of adjustment of the interlayer exchange coupling force Jex with regard to the magnetic layers of recording layer (A1), and the perspective of reduced stray magnetic field.

The total film thickness of the first divided magnetic layer (3a) and first nonmagnetic insertion layer (3b) preferably is 0.5 nm to 3.0 nm, and more preferably 1.0 nm to 2.5 nm. The film thickness of the first nonmagnetic insertion layer (3b) also preferably is 0.5 nm to 1.0 nm in a case of Ru, 0.5 nm to 0.7 nm in a case of Ir, 0.7 nm to 1.0 nm in a case of Rh, 0.75 nm to 1.2 nm in a case of Os, and preferably is 0.5 nm to 0.95 nm in a case of Re.

Embodiment 4

Figure 4:
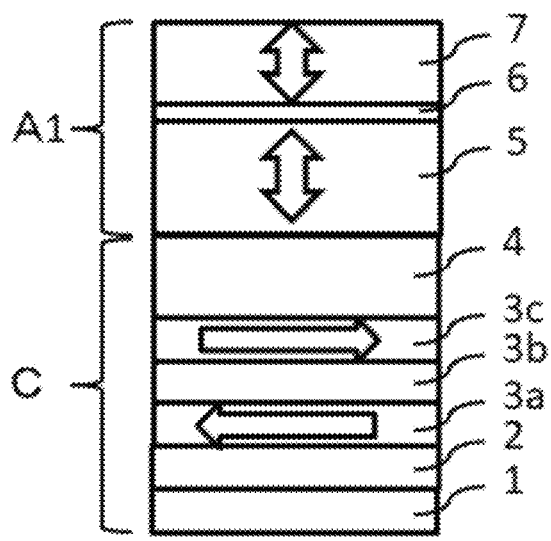
FIG. 4 is a longitudinal-sectional view showing another example of a configuration of a magnetoresistance effect element according to the present invention.

FIG. 4 shows a basic configuration of Embodiment 4 of the present invention. The configuration of this magnetoresistance effect element is the antiferromagnetic layer (2)/ first, divided magnetic layer (3a)/first nonmagnetic insertion layer (3b)/second divided magnetic layer (3c)/nonmagnetic spacer layer (4)/second magnetic layer (5)/second nonmagnetic insertion layer (6)/third magnetic layer (7) arrayed adjacently in order, the antiferromagnetic layer (2)/first divided magnetic layer (3a)/first nonmagnetic insertion layer (3b)/second divided magnetic layer (3c)/nonmagnetic spacer layer (4) configuring part of the channel layer (C), and the second magnetic layer (5)/second nonmagnetic insertion layer (6)/third magnetic layer (7) configuring the recording layer (A1). The details of Embodiment 4 are the same as those of Embodiment 2 and Embodiment 3.

Embodiment 5

Figure 5:
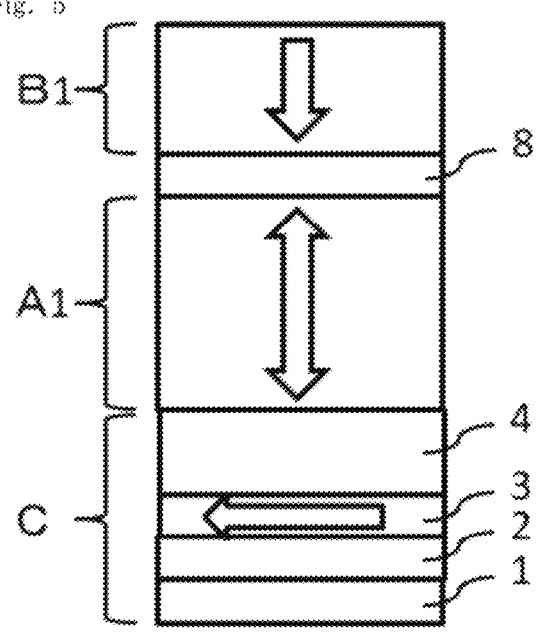
FIG. 5 is a longitudinal-sectional view showing another example of a configuration of a magnetoresistance effect element according to the present invention.

FIG. 5 shows a basic configuration of Embodiment 5 of the present invention. The basic configuration of this magnetoresistance effect element is the antiferromagnetic layer (2)/first magnetic layer (3)/nonmagnetic spacer layer (4)/ recording layer (A1)/barrier layer (8)/reference layer (B) arrayed adjacently in order, the antiferromagnetic layer (2)/first magnetic layer (3)/nonmagnetic spacer layer (4) configuring part of the channel layer (C). The details of Embodiment 5 are the same as those of Embodiment 1, except for the following points.

The barrier layer (8) contains at least O or N. Specific examples include MgO, MgAlO, Al2O3, AlN, and so forth.

The film thickness of the barrier layer (8) is preferably 0.1 nm to 5 nm, and further preferably 0.5 nm to 2 nm. If thinner than 0.1 nm, formation of a continuous film becomes difficult in relation to the size of atoms. Conversely, if thicker than 5 nm, film formation takes a long time, extending the amount of time to fabricate one wafer, which raises costs.

The reference layer (B1) is not limited in particular, as long as if a material, film thickness, and layer configuration that has its axis of easy magnetization in the film surface perpendicular direction, but includes at least one magnetic layer including at least a magnetic element such as Co, Fe, Ni, and so forth. The direction of perpendicular magnetization is fixed.

Embodiment 6

Figure 6A:
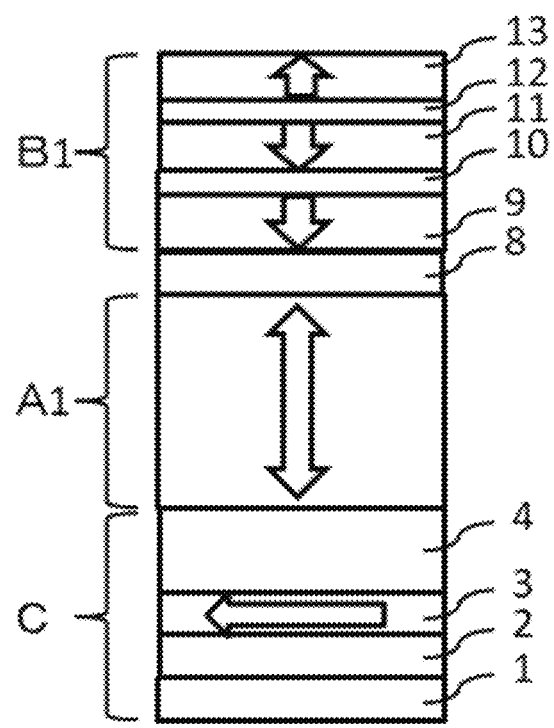
FIG. 6A is a longitudinal-sectional view showing another example of a configuration of a magnetoresistance effect element according to the present invention.
Figure 6B:
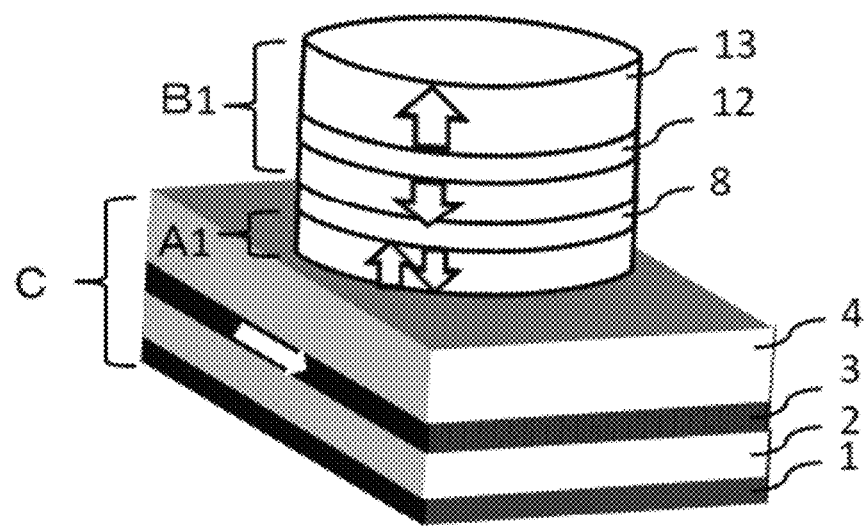
FIG. 6B is a perspective view of FIG. 6A.

FIG. 6A and FIG. 6B show a basic configuration of Embodiment 6 of the present invention. The basic configuration of this magnetoresistance effect element is the antiferromagnetic layer (2)/first magnetic layer (3)/nonmagnetic spacer layer (4)/recording layer (A1)/barrier layer (8)/fourth magnetic layer (9)/third nonmagnetic insertion layer (10)/ fifth magnetic layer (11)/nonmagnetic layer (12)/sixth magnetic layer (13) arrayed adjacently in order, the antiferromagnetic layer (2)/first magnetic layer (3)/nonmagnetic spacer layer (4) configuring part of the channel layer (C), and the fourth magnetic layer (9)/third nonmagnetic insertion layer (10)/fifth magnetic layer (11)/nonmagnetic layer (12)/sixth magnetic layer (13) configuring the reference layer (magnetically fixed layer) (B1). The details of Embodiment 6 are the same as those of Embodiment 5, except for the following points.

The fourth magnetic layer (9) of the reference layer (B1) includes at least one of Co, Ni, and Fe. B, C, N, O, Al, Si, P, Ga, Ge, or the like may be added to improve electrical material properties or the like. Preferable is Co, CoB, Ni, NiB, Fe, FeB, CoFe, CoNi, NiFe, CoFeB, and so forth, and more preferable is CoFeB.

The film thickness of the fourth magnetic layer (9) of the reference layer (B1) preferably is set to a range of 1.0 nm to 2.5 nm, and more preferably 1.0 nm to 1.7 nm.

The third nonmagnetic insertion layer (10) of the reference layer (B1) is configured of a nonmagnetic element such as W, Ta, Mo, or the like. One object of inserting the third nonmagnetic insertion layer (10) is for the adjacent fourth magnetic layer (9) to be in an amorphous state. Note that one object of placing the fourth magnetic layer (9) in an amorphous state is, in a case where the barrier layer adjacent to the recording layer is MgO, for (100)-oriented MgO, increasing the tunnel magnetoresistance ratio (TMR ratio).

The film thickness of the third nonmagnetic insertion layer (10) of the reference layer (B1) preferably is set to a range of 0.25 nm to 1.0 nm, and more preferably 0.3 nm to 0.6 nm.

The fifth magnetic layer (11) and sixth magnetic layer (13) of the reference layer (B1) are configured of a single-metal film, alloy film, or a multilayer film that has its axis of easy magnetization in the film surface perpendicular direction and that includes at least one of Co, Fe, and Ni.

Examples of the single-metal film or alloy film for the fifth magnetic layer (11) and sixth magnetic layer (13) of the reference layer (B1) include Co, Fe, Ni, CoFe, CoNi, FeNi, CoFeNi, and so forth. Also, and Pt, Pd, or the like may be added and alloyed to improve electrical and magnetic material properties or the like.

The film thickness of the single-metal film or alloy film preferably is set to a range of 1.0 nm to 10 nm, and more preferably 1.5 nm to 7 nm.

The fifth magnetic layer (11) and sixth magnetic layer (13) of the reference layer (B1) making up a multilayer film preferably are of a combination with good thermal stability, examples of which include Co/Pt, Co/Pd, and so forth.

The film thickness of the multilayer film is 0.2 nm to 0.6 nm per layer, the layer count is two to ten-fold, and the total film thickness of the multilayer film preferably is set to a range of 1.0 nm to 12 nm, and more preferably to 1.5 nm to 7 nm.

Examples of the nonmagnetic layer (12) of the reference layer (B1) include Ir, Ru, Rh, Os, Re, or an alloy or the like thereof.

The film thickness of the nonmagnetic layer (12) preferably is set to a range of 0.5 nm to 1.0 nm in a case of Ru, 0.5 nm to 0.7 nm in a case of Ir, 0.7 nm to 1.0 nm in a case of Rh, 0.75 nm to 1.2 nm in a case of Os, and 0.5 nm to 0.95 nm in a case of Re.

Embodiment 7

Figure 7:
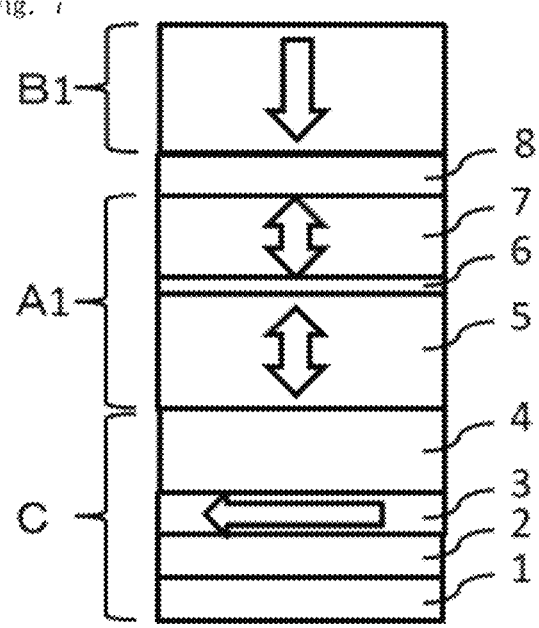
FIG. 7 is a longitudinal-sectional view showing another example of a configuration of a magnetoresistance effect element according to the present invention.

FIG. 7 shows a basic configuration of Embodiment 7 of the present invention. The configuration of this magnetoresistance effect element is the antiferromagnetic layer (2)/first magnetic layer (3)/nonmagnetic spacer layer (4)/second magnetic layer (5)/second nonmagnetic insertion layer (6)/third magnetic layer (7)/barrier layer (8)/reference layer (B1) arrayed adjacently in order, the antiferromagnetic layer (2)/first magnetic layer (3)/nonmagnetic spacer layer (4) configuring part of the channel layer (C), and the second magnetic layer (5)/second nonmagnetic insertion layer (6)/third magnetic layer (7) configuring the recording layer (A1). The details of Embodiment 7 are the same as those of Embodiment 2 and Embodiment 5.

Embodiment 8

Figure 8:
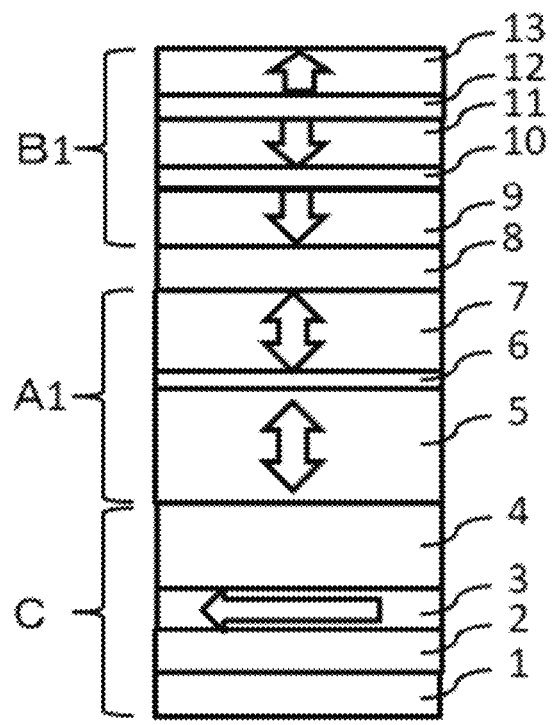
FIG. 8 is a longitudinal-sectional view showing another example of a configuration of a magnetoresistance effect element according to the present invention.

FIG. 8 shows a basic configuration of Embodiment 8 of the present invention. The configuration of this magnetoresistance effect element is the antiferromagnetic layer (2)/first magnetic layer (3)/nonmagnetic spacer layer (4)/second magnetic layer (5)/second nonmagnetic insertion layer (6)/third magnetic layer (7)/barrier layer (8)/fourth magnetic layer (9)/third nonmagnetic insertion layer (10)/fifth magnetic layer (11)/nonmagnetic layer (12)/sixth magnetic layer (13) arrayed adjacently in order, the antiferromagnetic layer (2)/first magnetic layer (3)/nonmagnetic spacer layer (4) configuring part of the channel layer (C), the second magnetic layer (5)/second nonmagnetic insertion layer (6)/third magnetic layer (7) configuring the recording layer (A1), and the fourth magnetic layer (9)/third nonmagnetic insertion layer (10)/fifth magnetic layer (i)/nonmagnetic layer (12)/sixth magnetic layer (13) configuring the reference layer (B1). The details of Embodiment 8 are the same as those of Embodiment 2 and Embodiment 6.

Embodiment 9

Figure 9:
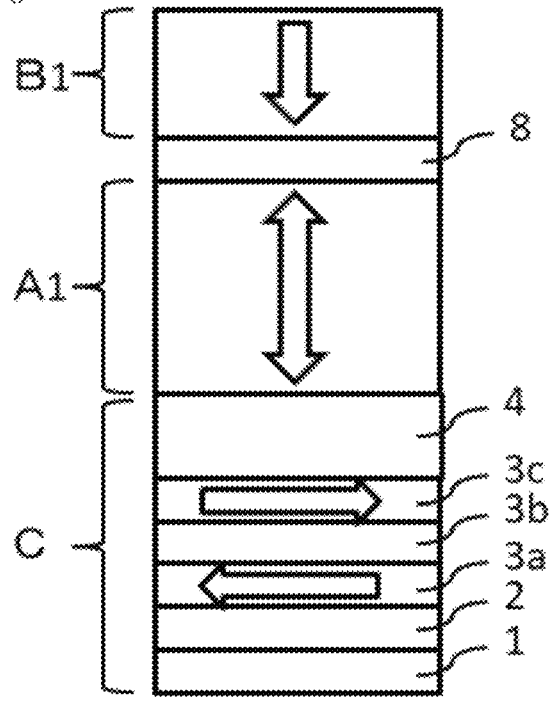
FIG. 9 is a longitudinal-sectional view showing another example of a configuration of a magnetoresistance effect element according to the present invention.

FIG. 9 shows a basic configuration of Embodiment 9 of the present invention. The configuration of this magnetoresistance effect element is the antiferromagnetic layer (2)/first divided magnetic layer (3a)/first nonmagnetic insertion layer (3b)/second divided magnetic layer (3c)/nonmagnetic spacer layer (4)/recording layer (A1)/barrier layer (8)/reference layer (B1) arrayed adjacently in order, the antiferromagnetic layer (2)/first divided magnetic layer (3a)/first nonmagnetic insertion layer (3b)/second divided magnetic layer (3c)/nonmagnetic spacer layer (4) configuring part of the channel layer (C). The details of Embodiment 9 are the same as those of Embodiment 3 and Embodiment 5.

Embodiment 10

Figure 10A:
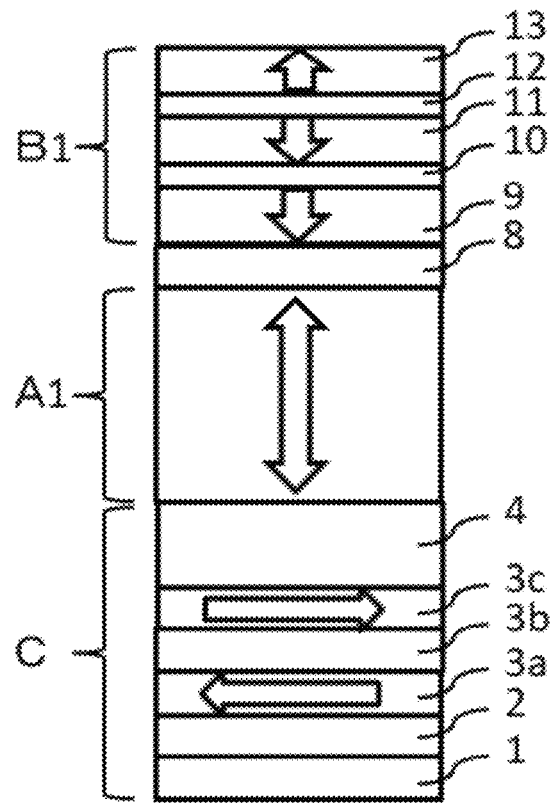
FIG. 10A is a longitudinal-sectional view showing another example of a configuration of a magnetoresistance effect element according to the present invention.
Figure 10B:
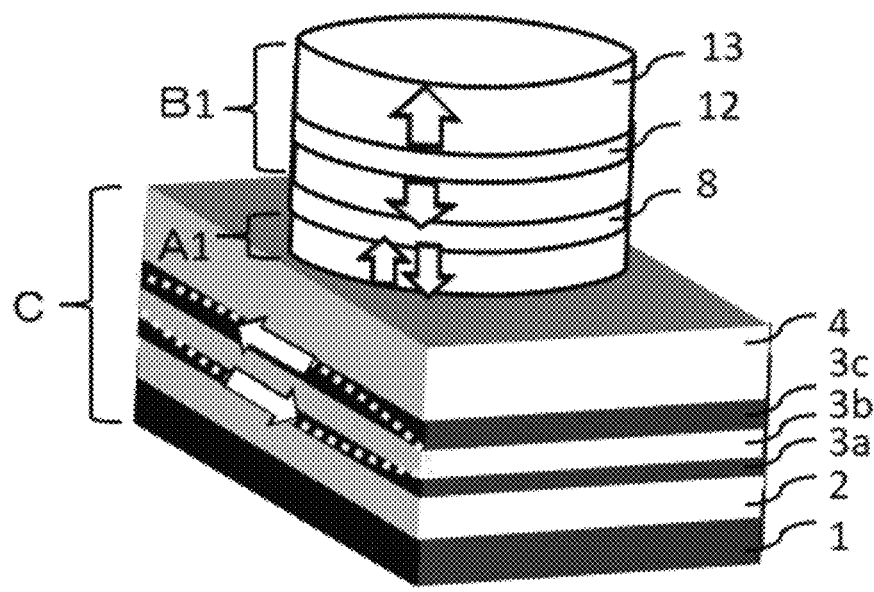
FIG. 10B is a perspective view of FIG. 10A.

FIG. 10A and FIG. 10B show a basic configuration of Embodiment 10 of the present invention. The configuration of this magnetoresistance effect element is the antiferromagnetic layer (2)/first divided magnetic layer (3a)/first nonmagnetic insertion layer (3b)/second divided magnetic layer (3c)/nonmagnetic spacer layer (4)/recording layer (A1)/barrier layer (8)/fourth magnetic layer (9)/third nonmagnetic insertion layer (10)/fifth magnetic layer (11)/nonmagnetic layer (12)/sixth magnetic layer (13) arrayed adjacently in order, the antiferromagnetic layer (2)/first divided magnetic layer (3a)/first nonmagnetic insertion layer (3b)/second divided magnetic layer (3c)/nonmagnetic spacer layer (4) configuring part of the channel layer (C), and the fourth magnetic layer (9)/third nonmagnetic insertion layer (10)/fifth magnetic layer (11)/nonmagnetic layer (12)/sixth magnetic layer (13) configuring the reference layer (B1). The details of Embodiment 10 are the same as those of Embodiment 3 and Embodiment 6.

Embodiment 11

FIG. 11 shows a basic configuration of Embodiment 11 of the present invention. The configuration of this magnetoresistance effect element is the antiferromagnetic layer (2)/first divided magnetic layer (3a)/first nonmagnetic insertion layer (3b)/second divided magnetic layer (3c)/nonmagnetic spacer layer (4)/second magnetic layer (5)/second nonmagnetic insertion layer (6)/third magnetic layer (7)/barrier layer (8)/reference layer (B1) arrayed adjacently in order, the antiferromagnetic layer (2)/first divided magnetic layer (3a)/first nonmagnetic insertion layer (3b)/second divided magnetic layer (3c)/nonmagnetic spacer layer (4) configuring part of the channel layer (C), and the second magnetic layer (5)/second nonmagnetic insertion layer (6)/third magnetic layer (7) configuring the recording layer (A1). The details of Embodiment 11 are the same as those of Embodiment 4 and Embodiment 5.

Embodiment 12

FIG. 12 shows a basic configuration of Embodiment 12 of the present invention. The configuration of this magnetoresistance effect element is the antiferromagnetic layer (2)/first divided magnetic layer (3a)/first nonmagnetic insertion layer (3b)/second divided magnetic layer (3c)/nonmagnetic spacer layer (4)/second magnetic layer (5)/second nonmagnetic insertion layer (6)/third magnetic layer (7)/barrier layer (8)/fourth magnetic layer (9)/third nonmagnetic insertion layer (10)/fifth magnetic layer (11)/nonmagnetic layer (12)/sixth magnetic layer (13) arrayed adjacently in order, the antiferromagnetic layer (2)/first divided magnetic layer (3a)/first nonmagnetic insertion layer (3b)/second divided magnetic layer (3c)/nonmagnetic spacer layer (4) configuring part of the channel layer (C), the second magnetic layer (5)/second nonmagnetic insertion layer (6)/third magnetic layer (7) configuring the recording layer (A1), and the fourth magnetic layer (9)/third nonmagnetic insertion layer (10)/fifth magnetic layer (11)/nonmagnetic layer (12)/sixth magnetic layer (13) configuring the reference layer (B1). The details of Embodiment 12 are the same as those of Embodiment 4 and Embodiment 6.

Embodiment 13

Figure 13:
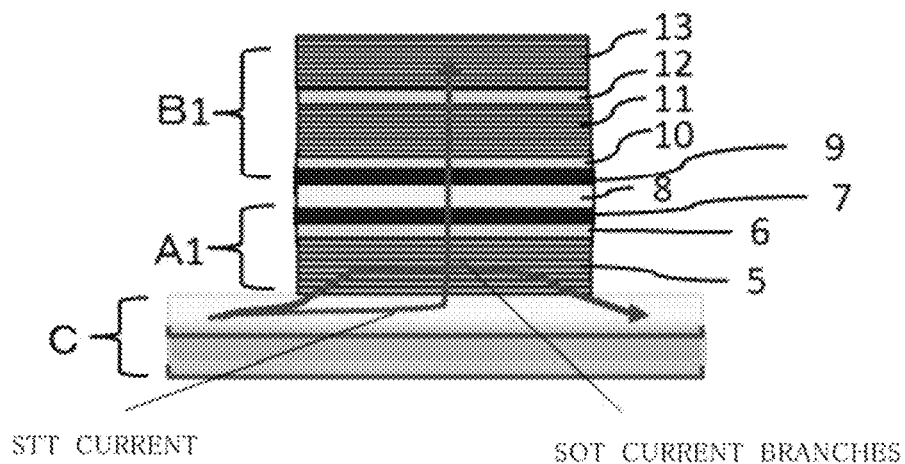
FIG. 13 shows an example of SOT current branching from STT current, in a longitudinal-sectional view showing another example of a configuration of a magnetoresistance effect element according to the present invention.

FIG. 13 shows a configuration of Embodiment 13 of the present invention. The configuration of this magnetoresistance effect element is the same as that of Embodiment 8, showing the way that writing current flows to channel layer (C)(SOT current), and flows toward the recording layer (A1)/barrier layer (8)/reference layer (B1) (STT current).

As described in Embodiment 2, employing a multilayer film where the spin Fall angle ΘSH is large for part of the magnetic layers of the recording layer (A1) improves magnetization reversal efficiency regarding SOT, and accordingly the writing current IC can be small. Note that there is a relation where the writing current IC becomes large when a damping constant α is large in magnetization reversal by STT, but even if the damping constant α is large in magnetic reversal regarding SOT, this is unrelated to the writing current IC.

Also, the multilayer film configuration of the second magnetic layer (5) of the recording layer (A1) in Embodiment 13 of the present invention can improve the thermal stability index Δ. For example, in a multilayer structure of Co 0.4 nm/Pt 0.4 nm, the thermal stability index Δ in a case of a two-fold layered magnetoresistance effect element 20 nm in diameter was 210, and the thermal stability index Δ in a case of a three-fold layered magnetoresistance effect element 10 nm in diameter was 79. Note that in recent years, the thermal stability index Δ required in magnetoresistance effect elements is no less than 60. Also, current reversal efficiency can be improved by applying writing current (pulse current, SOT current) to the channel layer (C) and also applying writing current (pulse current, STT current) to the magnetic tunnel junction (in a film surface perpendicular direction regarding the recording layer) in conjunction.

Embodiment 14

Figure 14:
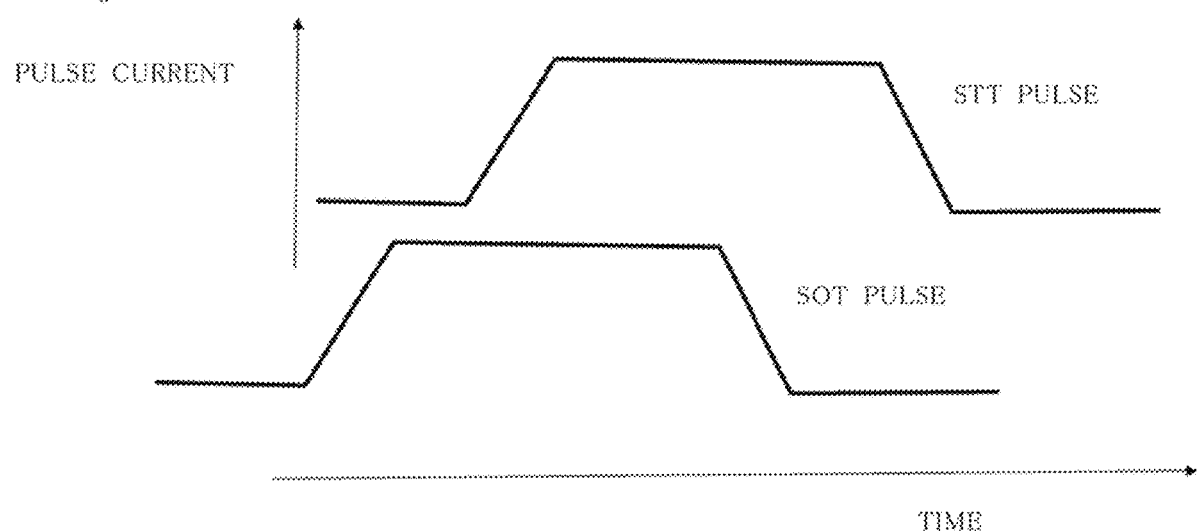
FIG. 14 shows an example of a pulse sequence of a magnetoresistance effect element according to the present invention.

FIG. 14 shows a pulse sequence example of Embodiment 14 of the present invention.

As in Embodiment 13, current reversal efficiency can be improved by applying writing current (pulse current, SOT current) to the channel layer (C) and also applying writing current (pulse current, STT current) to the magnetic tunnel junction (in a film surface perpendicular direction regarding the recording layer) in conjunction.

Now, there is a problem in Z type magnetoresistance effect elements that abnormalities in reversal behavior are observed at high-current regions (back-hopping), and the reversal error rate of returning to the original spin state after magnetization reversal rises. This problem is also solved at the same time by turning the STT current Off after turning the SOT current Off, since the magnetic direction after reversal is stabilized by the STT current.

Embodiment 15

FIG. 15 shows a configuration of Embodiment 15 of the present invention in (a), and examples of pulse sequences applied in (b) to (d).

The configuration of the magnetoresistance effect element is as follows.

Foundation layer (1): Ta (2 nm)
Antiferromagnetic layer (2): NiO (10 nm)
First divided magnetic layer (3a): Co (1.0 nm)
First nonmagnetic insertion layer (3b): Ru (0.8 nm)
Second divided magnetic layer (3c): Co (1.0 nm)
Nonmagnetic spacer layer (4): Ir (2.5 nm)
Second magnetic layer (5): (Co (0.4 nm)/Pt (0.4 nm))1/Co (0.4 nm)
Second nonmagnetic insertion layer (6): W (0.5 nm)
Third magnetic layer (7): CoFeB (1.0 nm)
Barrier layer (8): MgO (1.0 nm)
Fourth magnetic layer (9): CoFeB (1.0 nm)
Third nonmagnetic insertion layer (10): W (0.5 nm)
Fifth magnetic layer (11): (Co (0.4 nm)/Pt (0.4 nm))5/Co (0.4 nm)
Nonmagnetic layer (12): Ru (0.8 nm)
Sixth magnetic layer (13): (Co (0.4 nm)/Pt (0.4 nm))7

In the applied pulse sequence, if the STT current is turned Off after the SOT current is turned Off, abnormalities in reversal behavior observed at high-current regions (back-hopping) do not occur, as shown in FIG. 15(b) to FIG. 15(d).

Embodiment 16

Figure 16A:
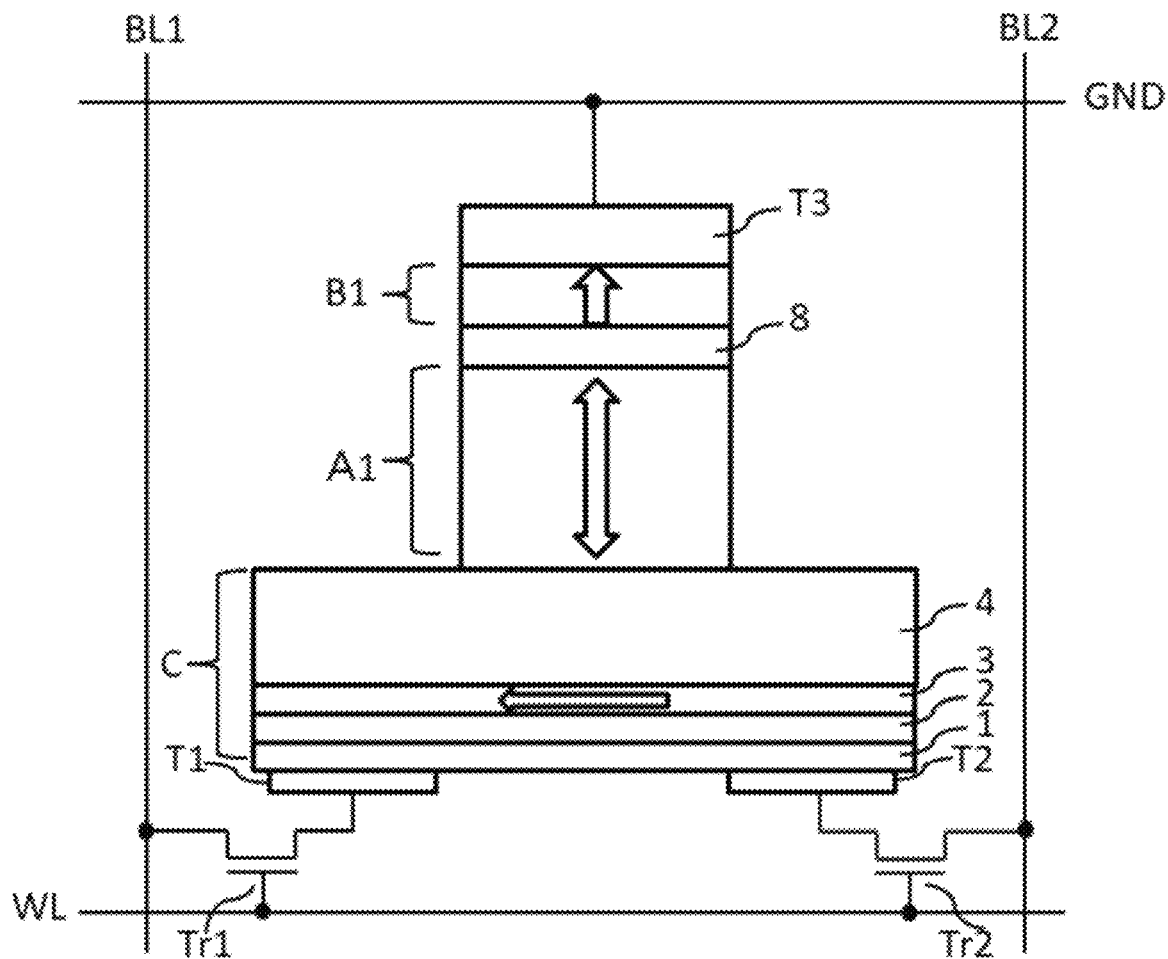
FIG. 16A shows an example of a circuit configuration of a 1-bit memory cell using the magnetoresistance effect element according to the present invention.

FIG. 16A shows a circuit configuration of a 1-bit magnetic memory cell as an example of Embodiment 16. The 1-bit magnetic memory cell circuit is provided with the magnetoresistance effect element according to Embodiment 8, a first bit line (BL1), a second bit line (BL2), a word line (L), a ground line (GND), a first transistor (Tr1), a second transistor (Tr2), a first terminal (T1), a second terminal (T2), and a third terminal (T3).

In a case of writing data to the magnetic memory cell circuit, a difference is provided in the level settings of the first bit line (BL1) and the second bit line (BL2). This introduces writing current IC to a channel layer (C), and the magnetization direction of the recording layer (A1) is reversed and data is written.

In a case of reading data out from the magnetic memory cell circuit, the word line (WL) is set to an active level, after which the first transistor (Tr1) and the second transistor (Tr2) are turned ON, and both of the first bit line (BL1) and the second bit line (BL2) are set to High level or one is set to High level and the other is released. Thus, reading current flows through the channel layer (C)→recording layer (A1)→barrier layer (8)→reference layer (B1)→third terminal (T3)→ground line (GND), and recorded data is read from the resistance value of the path.

Figure 16B:
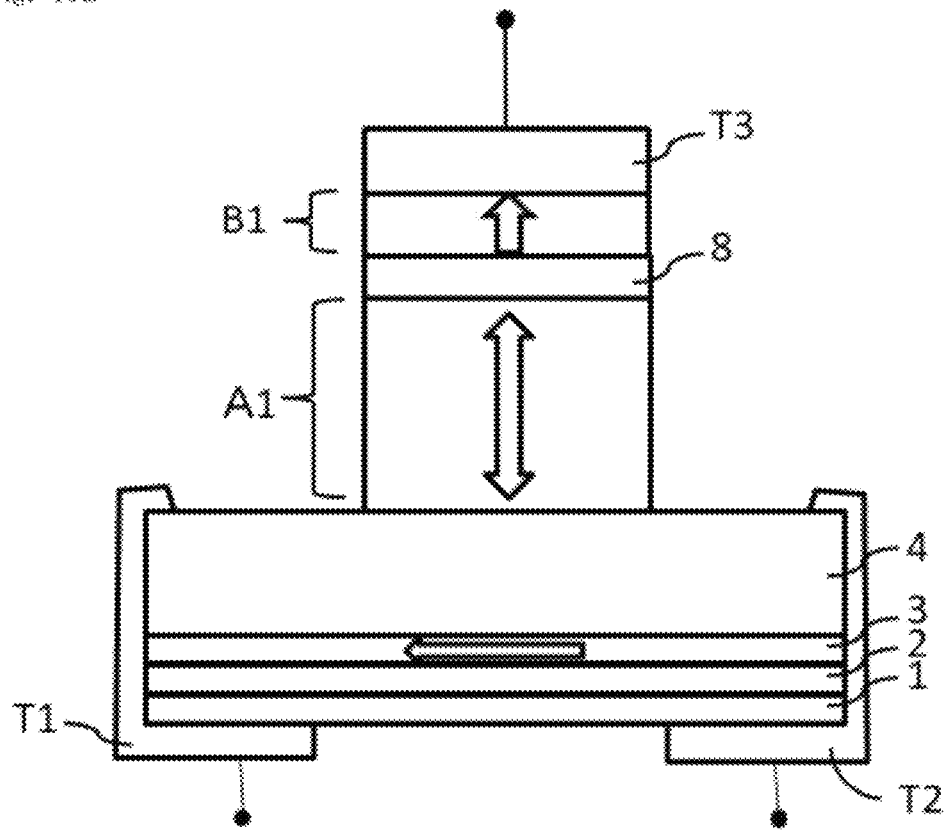
FIG. 16B shows another example of a circuit configuration of a 1-bit memory cell using the magnetoresistance effect element according to the present invention.

FIG. 16B shows another example of Embodiment 16. The first terminal (T1) is connected to one end side portion of the channel layer (C) and the second terminal (T2) is connected to the other end side portion of the channel layer (C), with the third terminal (T3) connected to the reference layer (B1) being provided on the opposite side from the substrate. Using this configuration enables current to be applied to the channel layer (C) even if a layer with high resistance such as an oxide or the like is used for the antiferromagnetic material.

Figure 16C:
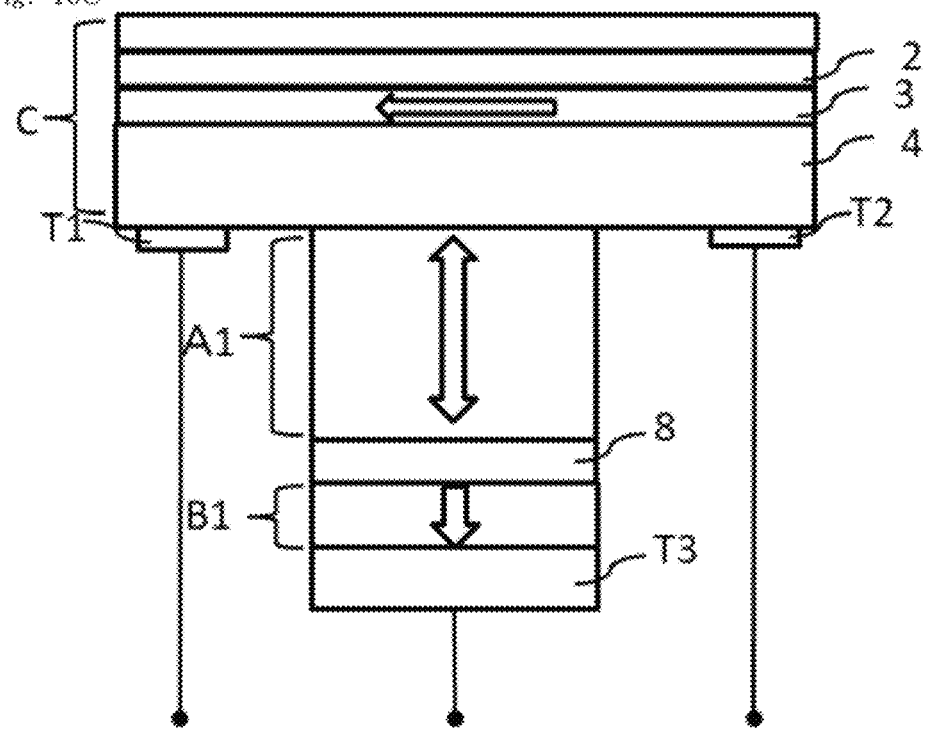
FIG. 16C shows another example of a circuit configuration of a 1-bit memory cell using the magnetoresistance effect element according to the present invention.

FIG. 16C shows another example of Embodiment 16. The first terminal (T1) connected to one end portion of the channel layer (C), the second terminal (T2) connected to the other end portion, and the third terminal (T3) connected to the reference layer (B1) are all provided on the substrate side. Providing all terminals on the substrate side does away with the need for wiring on the top of the magnetoresistance effect element, and the cell size can be made smaller. Also, this is a preferable example where an oxide such as NiO, FeOx, or the like, is used for the antiferromagnetic layer (2).

FIG. 16D shows another example of Embodiment 16. The first terminal (T1) and the second terminal (T2) are provided on the opposite side from the substrate, with the third terminal (13) provided on the substrate side. This enables an efficient layout in a case where input signals are supplied from above the magnetoresistance effect element.

The magnetic memory cell circuit configuration of Embodiment 16 is exemplary, and it is sufficient to have a circuit configuration where the writing current IC is introduced to the channel layer when writing, and the magnetic resistance of the recording layer (A1) and reference layer (B1) situated across the barrier layer (8) be readable when reading out.

Also, in a case of using STT current in conjunction as in Embodiments 13 and 14, it is sufficient to have a circuit configuration where the writing current IC is introduced to the channel layer (C), and the writing current IC is also introduced to the recording layer (A1)/barrier layer (8)/reference layer (B1) when writing, and the magnetic resistance of the recording layer (A1) and reference layer (B1) situated across the barrier layer (8) be readable when reading out.

Embodiment 17

Figure 17:
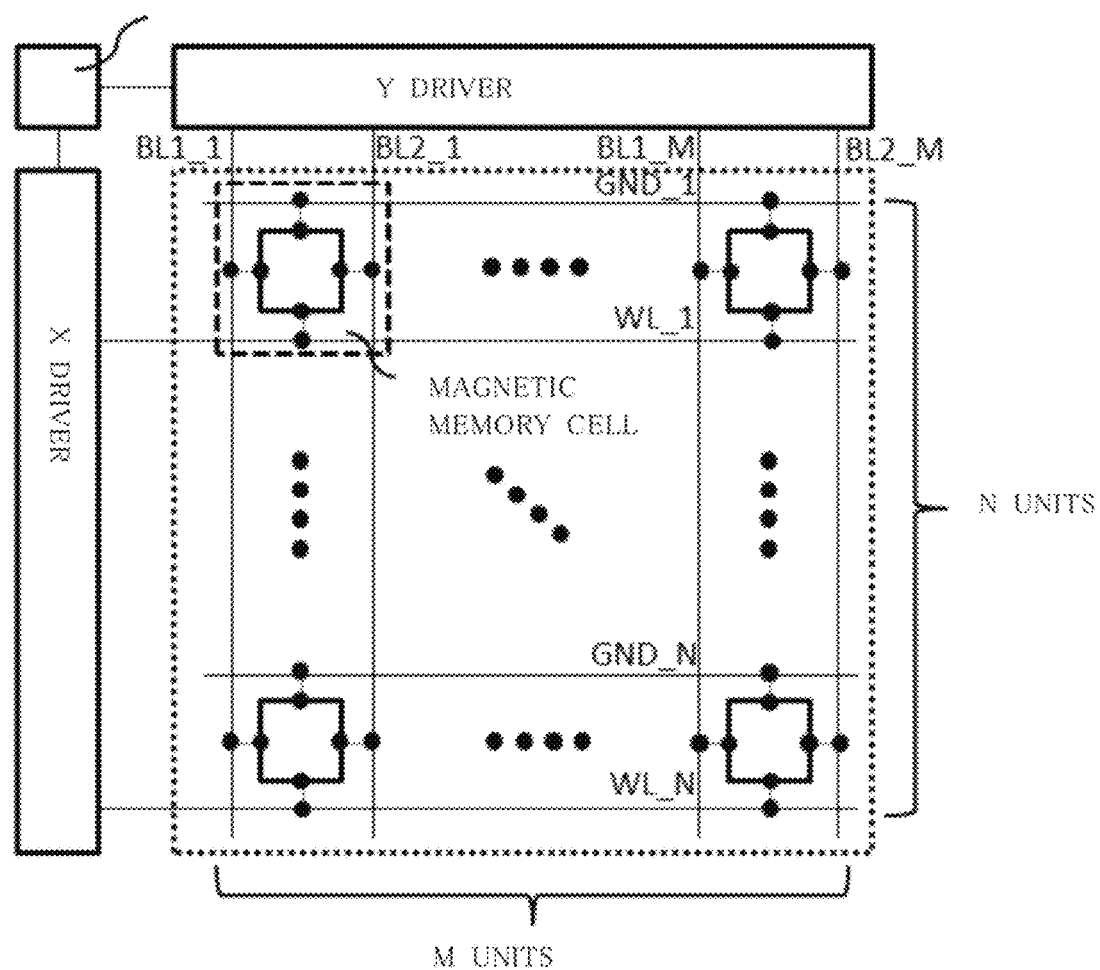
FIG. 17 is an example of a block diagram of magnetic memory where a plurality of magnetoresistance effect elements according to the present invention has been arrayed.

FIG. 17 shows magnetic memory provided with a plurality of magnetic memory cells according to Embodiment 16, as Embodiment 17.

The magnetic memory is provided with a memory cell array, an X driver, a Y driver, and a controller. The memory cell array has magnetic memory cells laid out in an array. The X driver is connected to a plurality of word lines (WL), and the Y driver is connected to a plurality of bit lines (BL), functioning as reading means and writing means.

Note that it is sufficient for the layer configurations shown in the embodiments to be layered in order adjacently, and that the method of layering, the order of layering, the up-down left-right directions and so forth are not limited.

REFERENCE SIGNS LIST

1 Foundation layer
2 Antiferromagnetic layer
3 First magnetic layer
3a First divided magnetic layer
3b First nonmagnetic insertion layer
3c Second divided magnetic layer
4 Nonmagnetic spacer layer
5 Second magnetic layer
6 Second nonmagnetic insertion layer
7 Third magnetic layer
8 Barrier layer
9 Fourth magnetic layer
10 Third nonmagnetic insertion layer
11 Fifth magnetic layer
12 Nonmagnetic layer
13 Sixth magnetic layer
A1 Recording layer
B1 Reference layer
C Channel layer
BL1 First bit line
BL2 Second bit line
GND Ground line
T1 First terminal
T2 Second terminal
T3 Third terminal
Tr1 First transistor
Tr2 Second transistor
WL Word line

The invention claimed is:
1. A magnetoresistance effect element, comprising:
a channel layer; and
a recording layer containing a ferromagnetic material, and provided adjacent to the channel layer,
wherein the channel layer includes a first magnetic layer and a nonmagnetic spacer layer, the nonmagnetic spacer layer being provided adjacent to the recording layer, and the first magnetic layer being provided adjacent to an opposite side of the nonmagnetic spacer layer from the recording layer,
wherein the recording layer has an axis of easy magnetization in a film surface perpendicular direction,
wherein a direction of magnetization of the first magnetic layer is an in-plane direction,
wherein the nonmagnetic spacer layer includes at least one element of Ir, Pt, Pd, Os, and Re, and is configured to adjust an interlayer exchange coupling strength between the recording layer and the first magnetic layer,
wherein a direction of magnetization of the recording layer is reversed by introducing current to the channel layer that is in an approximately parallel direction or an approximately anti-parallel direction as to the direction of magnetization of the first magnetic layer, and
wherein a film thickness of the nonmagnetic spacer layer is 1.2 nm to 5.0 nm in a case of including Ir as a primary element, 2.0 nm to 7.0 nm in a case of including Pt as a primary element, 1.0 nm to 5.0 nm in a case of including Pd as a primary element, 1.2 nm to 5.0 nm in a case of including Os as a primary element, and 0.5 nm to 5.0 nm in a case of including Re as a primary element.

2. The magnetoresistance effect element according to claim 1, wherein the first magnetic layer includes an element of at least one of Co, Fe, and Ni.

3. The magnetoresistance effect element according to claim 1, wherein the recording layer includes a second magnetic layer, a second nonmagnetic insertion layer, and a third magnetic layer,
wherein the second magnetic layer is provided adjacent to the nonmagnetic spacer layer,
wherein the second nonmagnetic insertion layer is provided adjacent to an opposite side of the second magnetic layer from the nonmagnetic spacer layer,
wherein the third magnetic layer is provided adjacent to an opposite side of the second nonmagnetic insertion layer from the second magnetic layer, and
wherein the second magnetic layer is configured of a multilayer film or an alloy film including at least Co, and has an axis of easy magnetization in the film surface perpendicular direction.

4. The magnetoresistance effect element according to claim 1, wherein the first magnetic layer, configuring the channel layer, includes a first divided magnetic layer, a first nonmagnetic insertion layer, and a second divided magnetic layer,
wherein the second divided magnetic layer is provided adjacent to the nonmagnetic spacer layer,
wherein the first nonmagnetic insertion layer is provided adjacent to an opposite side of the second divided magnetic layer from the nonmagnetic spacer layer,
wherein the first divided magnetic layer is provided adjacent to an opposite side of the first nonmagnetic insertion layer from the second divided magnetic layer, and
wherein the first divided magnetic layer and the second divided magnetic layer have in-plane magnetic anisotropy in opposite directions from each other.

5. The magnetoresistance effect element according to claim 1, wherein an antiferromagnetic layer is provided adjacent to an opposite side of the first magnetic layer from the nonmagnetic spacer layer.

6. The magnetoresistance effect element according to claim 5, wherein the antiferromagnetic layer includes O or Mn.

7. The magnetoresistance effect element according to claim 1, wherein, when writing to the magnetoresistance effect element, a writing pulse current applied to a magnetic tunnel junction is turned Off after a writing pulse current applied to the channel layer.

8. A magnetic memory, comprising the magnetoresistance effect element according to claim 1.

9. The magnetoresistance effect element according to claim 1, wherein the first magnetic layer, configuring the channel layer, includes a first divided magnetic layer, a first nonmagnetic insertion layer, and a second divided magnetic layer.

10. The magnetoresistance effect element according to claim 9, wherein the second divided magnetic layer is provided adjacent to the nonmagnetic spacer layer.

11. The magnetoresistance effect element according to claim 10, wherein the first nonmagnetic insertion layer is provided adjacent to an opposite side of the second divided magnetic layer from the nonmagnetic spacer layer.

12. A magnetoresistance effect element, comprising:
a channel layer; and
a recording layer containing a ferromagnetic material, and provided adjacent to the channel layer,
wherein the channel layer includes a first magnetic layer and a nonmagnetic spacer layer, the nonmagnetic spacer layer being provided adjacent to the recording layer, and the first magnetic layer being provided adjacent to an opposite side of the nonmagnetic spacer layer from the recording layer,
wherein the recording layer has an axis of easy magnetization in a film surface perpendicular direction,
wherein a direction of magnetization of the first magnetic layer is an in-plane direction,
wherein the nonmagnetic spacer layer includes at least one element of Ir, Pt, Pd, Os, and Re,
wherein a film thickness of the nonmagnetic spacer layer is 1.2 nm to 5.0 nm in a case of including Ir as a primary element, 2.0 nm to 7.0 nm in a case of including Pt as a primary element, 1.0 nm to 5.0 nm in a case of including Pd as a primary element, 1.2 nm to 5.0 nm in a case of including Os as a primary element, and 0.5 nm to 5.0 nm in a case of including Re as a primary element, and
wherein a direction of magnetization of the recording layer is reversed by introducing current to the channel layer that is in an approximately parallel direction or an approximately anti-parallel direction as to the direction of magnetization of the first magnetic layer.

13. The magnetoresistance effect element according to claim 12, wherein the first magnetic layer includes an element of at least one of Co, Fe, and Ni.

14. The magnetoresistance effect element according to claim 12, wherein the recording layer includes a second magnetic layer, a second nonmagnetic insertion layer, and a third magnetic layer,
wherein the second magnetic layer is provided adjacent to the nonmagnetic spacer layer,
wherein the second nonmagnetic insertion layer is provided adjacent to an opposite side of the second magnetic layer from the nonmagnetic spacer layer,
wherein the third magnetic layer is provided adjacent to an opposite side of the second nonmagnetic insertion layer from the second magnetic layer, and
wherein the second magnetic layer is configured of a multilayer film or an alloy film including at least Co, and has an axis of easy magnetization in the film surface perpendicular direction.

15. The magnetoresistance effect element according to claim 12, wherein the first magnetic layer, configuring the channel layer, includes a first divided magnetic layer, a first nonmagnetic insertion layer, and a second divided magnetic layer,
wherein the second divided magnetic layer is provided adjacent to the nonmagnetic spacer layer,
wherein the first nonmagnetic insertion layer is provided adjacent to an opposite side of the second divided magnetic layer from the nonmagnetic spacer layer,
wherein the first divided magnetic layer is provided adjacent to an opposite side of the first nonmagnetic insertion layer from the second divided magnetic layer, and
wherein the first divided magnetic layer and the second divided magnetic layer have in-plane magnetic anisotropy in opposite directions from each other.

16. The magnetoresistance effect element according to claim 12, wherein an antiferromagnetic layer is provided adjacent to an opposite side of the first magnetic layer from the nonmagnetic spacer layer.

17. The magnetoresistance effect element according to claim 16, wherein the antiferromagnetic layer includes O or Mn.

18. The magnetoresistance effect element according to claim 12, wherein, when writing to the magnetoresistance effect element, a writing pulse current applied to a magnetic tunnel junction is turned Off after a writing pulse current applied to the channel layer.

19. A magnetic memory, comprising the magnetoresistance effect element according to claim 12.

20. A magnetoresistance effect element, comprising:
a channel layer; and
a recording layer containing a ferromagnetic material, and provided adjacent to the channel layer,
wherein the channel layer includes a first magnetic layer and a nonmagnetic spacer layer, the nonmagnetic spacer layer being provided adjacent to the recording layer, and the first magnetic layer being provided adjacent to an opposite side of the nonmagnetic spacer layer from the recording layer,
wherein the recording layer has an axis of easy magnetization in a film surface perpendicular direction,
wherein a direction of magnetization of the first magnetic layer is an in-plane direction,
wherein the nonmagnetic spacer layer includes at least one element of Ir, Pt, Pd, Os, and Re, and is configured to adjust an interlayer exchange coupling strength between the recording layer and the first magnetic layer,
wherein a direction of magnetization of the recording layer is reversed by introducing current to the channel layer that is in an approximately parallel direction or an approximately anti-parallel direction as to the direction of magnetization of the first magnetic layer, and
wherein an antiferromagnetic layer is provided adjacent to an opposite side of the first magnetic layer from the nonmagnetic spacer layer.

21. The magnetoresistance effect element according to claim 20, wherein a film thickness of the nonmagnetic spacer layer is 1.2 nm to 5.0 nm in a case of including Ir as a primary element, 2.0 nm to 7.0 nm in a case of including Pt as a primary element, 1.0 nm to 5.0 nm in a case of including Pd as a primary element, 1.2 nm to 5.0 nm in a case of including Os as a primary element, and 0.5 nm to 5.0 nm in a case of including Re as a primary element.

22. The magnetoresistance effect element according to claim 20, wherein the antiferromagnetic layer includes O or Mn.

23. A magnetoresistance effect element, comprising:
a channel layer; and
a recording layer containing a ferromagnetic material, and provided adjacent to the channel layer,
wherein the channel layer includes a first magnetic layer and a nonmagnetic spacer layer, the nonmagnetic spacer layer being provided adjacent to the recording layer, and the first magnetic layer being provided adjacent to an opposite side of the nonmagnetic spacer layer from the recording layer,
wherein the recording layer has an axis of easy magnetization in a film surface perpendicular direction,
wherein a direction of magnetization of the first magnetic layer is an in-plane direction,
wherein the nonmagnetic spacer layer includes at least one element of Ir, Pt, Pd, Os, and Re, and is configured to adjust an interlayer exchange coupling strength between the recording layer and the first magnetic layer,
wherein a direction of magnetization of the recording layer is reversed by introducing current to the channel layer that is in an approximately parallel direction or an approximately anti-parallel direction as to the direction of magnetization of the first magnetic layer, and
wherein the first magnetic layer, configuring the channel layer, includes a first divided magnetic layer, a first nonmagnetic insertion layer, and a second divided magnetic layer.

24. The magnetoresistance effect element according to claim 23, wherein a film thickness of the nonmagnetic spacer layer is 1.2 nm to 5.0 nm in a case of including Ir as a primary element, 2.0 nm to 7.0 nm in a case of including Pt as a primary element, 1.0 nm to 5.0 nm in a case of including Pd as a primary element, 1.2 nm to 5.0 nm in a case of including Os as a primary element, and 0.5 nm to 5.0 nm in a case of including Re as a primary element.

* * * * *